US011174912B2

(12) United States Patent
Baldwin et al.

(10) Patent No.: US 11,174,912 B2
(45) Date of Patent: Nov. 16, 2021

(54) ANTI-SYMMETRIC SPRING

(71) Applicant: Bell Helicopter Textron Inc., Fort Worth, TX (US)

(72) Inventors: Tyler Wayne Baldwin, Keller, TX (US); Kyle Thomas Cravener, Watauga, TX (US)

(73) Assignee: TEXTRON INNOVATIONS INC., Providence, RI (US)

( * ) Notice: Subject to any disclaimer, the term of this patent is extended or adjusted under 35 U.S.C. 154(b) by 205 days.

(21) Appl. No.: 16/176,585

(22) Filed: Oct. 31, 2018

(65) Prior Publication Data
US 2020/0132152 A1 Apr. 30, 2020

(51) Int. Cl.
| *F16F 1/40* | (2006.01) |
| *F16F 3/12* | (2006.01) |
| *B64C 27/14* | (2006.01) |
| *G06F 30/17* | (2020.01) |
| *B64C 29/00* | (2006.01) |

(52) U.S. Cl.
CPC ............. *F16F 1/40* (2013.01); *F16F 3/12* (2013.01); *G06F 30/17* (2020.01); *B64C 27/14* (2013.01); *B64C 29/0033* (2013.01); *F16F 2224/025* (2013.01); *F16F 2224/0208* (2013.01); *F16F 2226/00* (2013.01); *F16F 2236/12* (2013.01)

(58) Field of Classification Search
CPC ........ F16F 1/40; F16F 3/12; F16F 2224/0208; F16F 2224/025; F16F 2226/00; F16F 2236/12; B64C 27/14; B64C 29/0033
See application file for complete search history.

(56) References Cited

U.S. PATENT DOCUMENTS

| 3,134,585 | A | * | 5/1964 | Walter | ....................... F16F 1/40 267/153 |
| 3,228,673 | A | * | 1/1966 | Hinks | ...................... F16C 33/24 267/282 |
| 4,768,630 | A | * | 9/1988 | Aubry | ...................... F16F 13/08 188/290 |
| 4,886,419 | A | * | 12/1989 | McCafferty | ............. B64C 27/35 416/134 A |
| 5,979,618 | A | * | 11/1999 | Sieg | ........................ B64C 27/51 188/322.19 |
| 6,325,327 | B1 | * | 12/2001 | Zoppitelli | ............. B64C 27/001 244/17.27 |

(Continued)

*Primary Examiner* — Robert A. Siconolfi
*Assistant Examiner* — James K Hsiao
(74) *Attorney, Agent, or Firm* — Edwin S. Flores; Daniel J. Chalker; Chalker Flores, LLP

(57) ABSTRACT

The present invention includes a torsion spring including a middle plate having a first attachment point displaced from the geometric center of the middle plate; a first elastomeric element secured to a first side of the middle plate and having an opening coincident with the first attachment point of the middle plate; a second elastomeric element secured to a second side of the middle plate and having an opening coincident with the first attachment point of the middle plate; a first outer plate secured to the first elastomeric element and having an opening coincident with the first attachment point of the middle plate; and a second outer plate secured to the second elastomeric element, having an opening coincident with the attachment point of the middle plate.

25 Claims, 20 Drawing Sheets

(56) References Cited

U.S. PATENT DOCUMENTS

| | | | | |
|---|---|---|---|---|
| 6,375,205 B1* | 4/2002 | Fontenay | .................. | F16D 3/28 |
| | | | | 280/93.502 |
| 8,167,561 B2* | 5/2012 | Jones | ...................... | F16F 15/08 |
| | | | | 416/140 |
| 8,911,153 B2* | 12/2014 | Cunningham | ............ | F16F 1/40 |
| | | | | 384/221 |
| 9,234,556 B1* | 1/2016 | Barendregt | ............. | F16F 1/373 |
| 9,644,697 B2* | 5/2017 | Mitsch | .................... | F16F 1/187 |
| 9,879,753 B2* | 1/2018 | McGill | ................ | B64C 27/635 |
| 9,970,502 B2* | 5/2018 | Myers | ........................ | F16F 1/40 |
| 10,144,262 B2* | 12/2018 | Noble | ...................... | B60G 5/02 |
| 10,264,886 B2* | 4/2019 | Masunaga | .............. | A47C 3/026 |
| 2003/0179964 A1* | 9/2003 | Hinks | .................... | F16J 15/50 |
| | | | | 384/138 |
| 2007/0145654 A1* | 6/2007 | Wietharn | ............... | B60G 11/22 |
| | | | | 267/141.1 |
| 2008/0023586 A1* | 1/2008 | Russell | .................. | F16F 1/387 |
| | | | | 244/131 |
| 2010/0007069 A1* | 1/2010 | Kawada | ................. | F16F 1/406 |
| | | | | 267/140.3 |

* cited by examiner

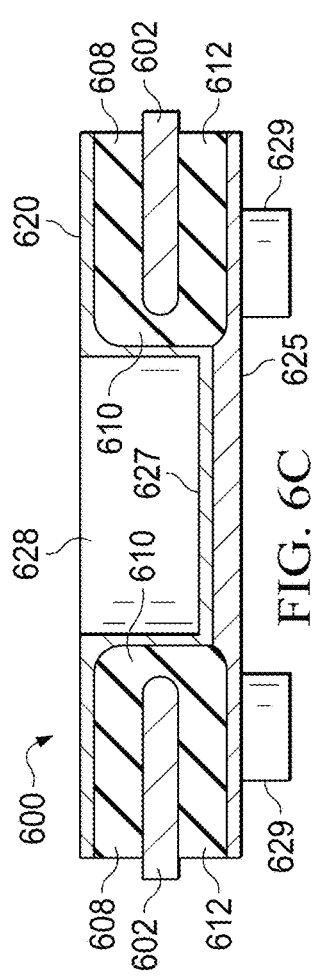
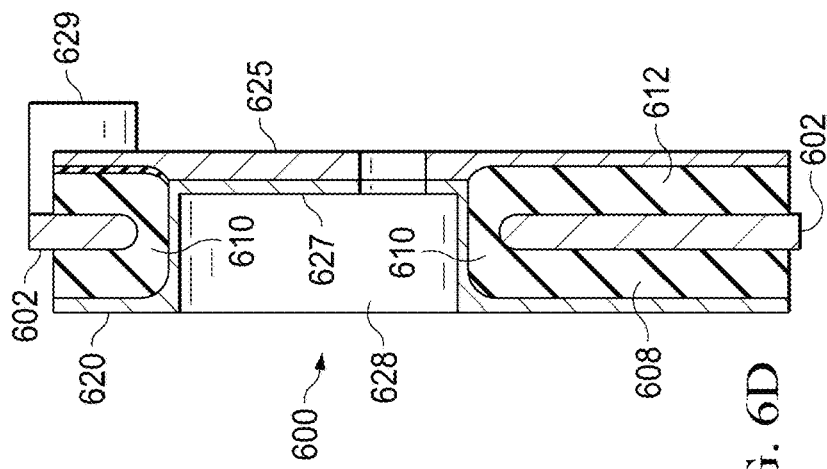
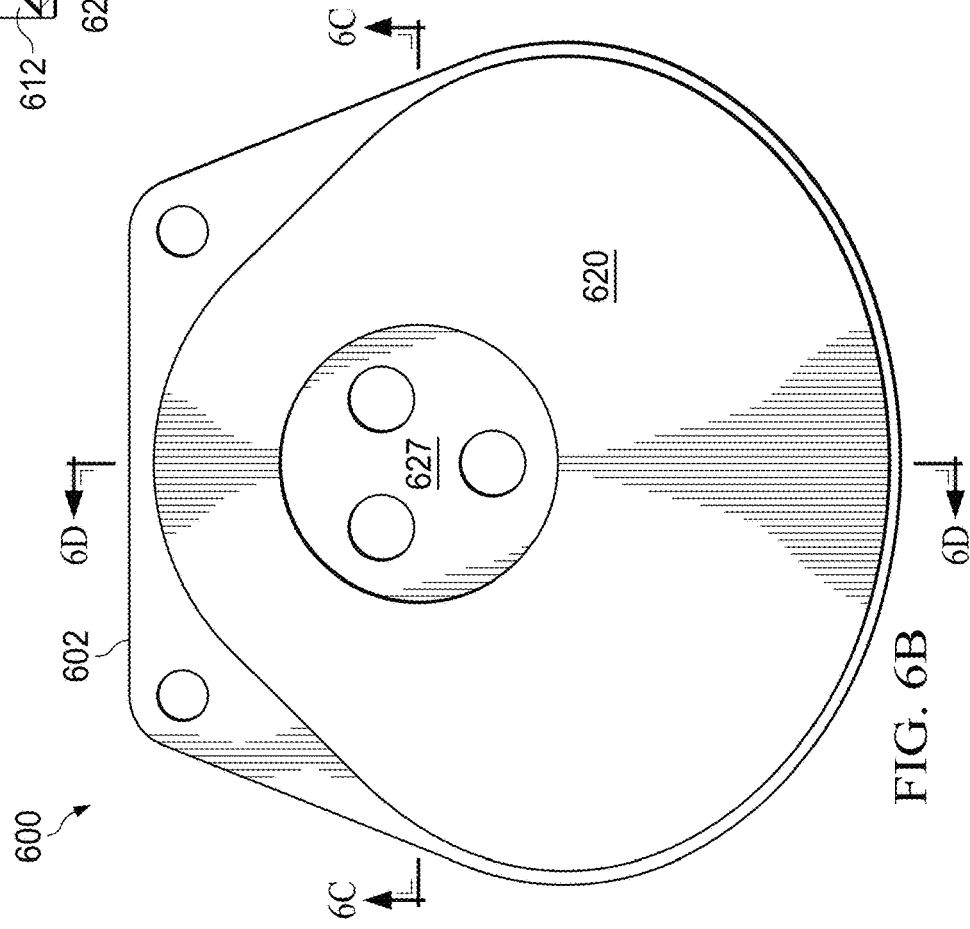

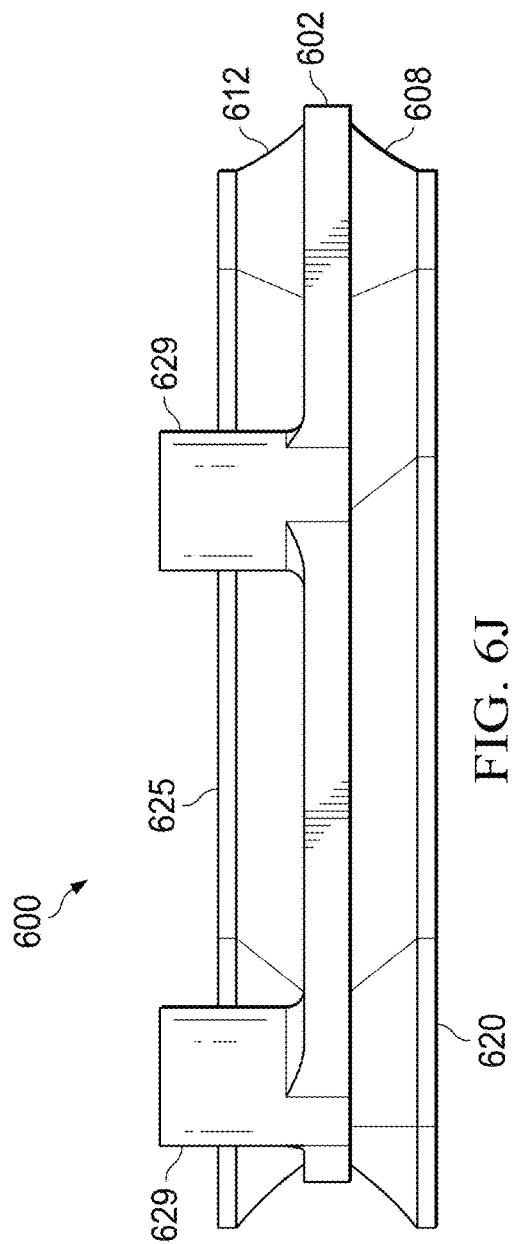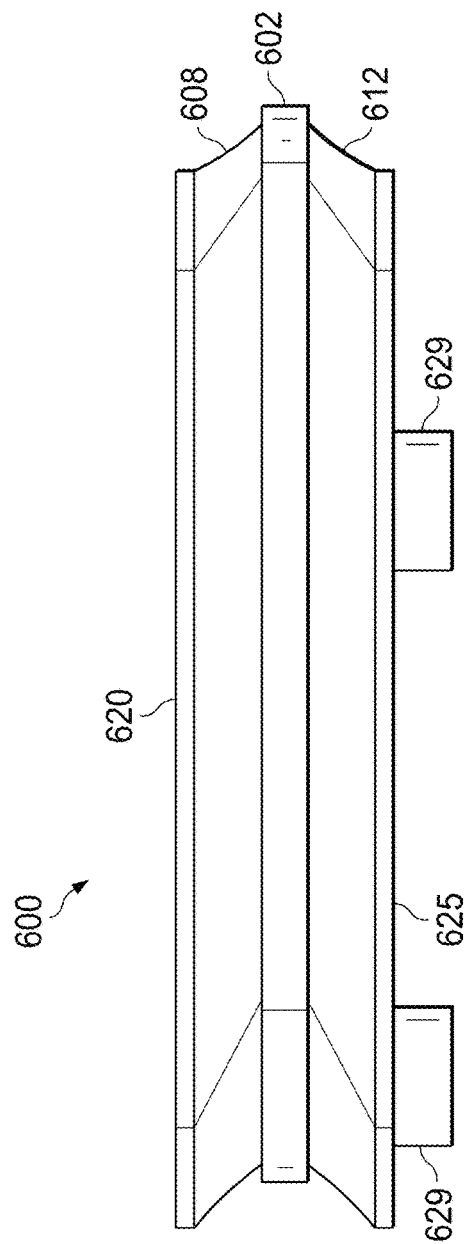

ANTI-SYMMETRIC SPRING

CROSS-REFERENCE TO RELATED APPLICATIONS

Not applicable.

STATEMENT OF FEDERALLY FUNDED RESEARCH

Not applicable.

TECHNICAL FIELD OF THE INVENTION

The present invention relates in general to the field of aircraft flight control and propulsion. In particular, the present invention relates to transmission of mechanical rotation and shear.

BACKGROUND OF THE INVENTION

Without limiting the scope of the invention, its background is described in connection with rotorcraft.

Typically, torsion springs are designed to be axisymmetric. Springs must often be used in small spaces, and in small spaces such axisymmetric torsion springs are generally too soft to serve their intended purposes. Also, axisymmetric torsion springs are generally circular in shape, and often will not fit into the small spaces in which torsion springs must be inserted, such as helicopter rotor hubs and swash plates. In addition, it is in many circumstances desirable to apply shear with torque. An asymmetric torsion spring is desirable for constricted spaces in which a stiff spring is required. A torsion spring that provides shear and torque is desirable.

SUMMARY OF THE INVENTION

In some embodiments of the disclosure, a torsion spring is disclosed as including a middle plate having a first attachment point displaced from a geometric center of the middle plate; one or more first elastomeric elements, wherein one of the first elastomeric elements proximate to a first side of the middle plate is secured to the first side of the middle plate and, and wherein the one or more first elastomeric elements has an opening coincident with the first attachment point of the middle plate; one or more second elastomeric elements, wherein one of the second elastomeric elements proximate to a second side of the middle plate is secured to the second side of the middle plate, and wherein the one or more second elastomeric elements has an opening coincident with the first attachment point of the middle plate; a first outer plate secured to one of the first elastomeric elements proximate to the first outer plate and having an opening coincident with the first attachment point of the middle plate; and a second outer plate secured to one of the second elastomeric elements proximate to the second outer plate and having an opening coincident with the attachment point of the middle plate; wherein rotation of an item attached to the torsion spring at the first attachment point rotationally displaces the middle plate relative to the first outer plate and the second outer plate and stores energy in the one or more first elastomeric elements and the one or more second elastomeric elements. In one aspect, the one or more first elastomeric elements or the one or more second elastomeric elements comprise one or more polymers or one or more rubbers. In another aspect, the first outer plate or the second outer plate comprises one or more spacers. In another aspect, the second outer plate comprises a second attachment point. In another aspect, the torsion spring further includes one or more shims, each shim having an elastic modulus value less than one or more elastic modulus values of the one or more first elastomeric elements or the one or more second elastomeric elements, each of the one or more shims disposed between two of the one or more first elastomeric elements or two of the one or more second elastomeric elements. In another aspect, the one or more shims are metallic.

In some embodiments of the disclosure, a torsion spring is disclosed as including a middle plate having an opening displaced from a geometric center of the middle plate; an elastomeric element having a first portion and a second portion, the first portion secured to a first side of the middle plate and the second portion secured to a second side of the middle plate, and the elastomeric element having an opening coincident with the opening of the middle plate; a first outer plate secured to the first portion of the elastomeric element, having an indentation coincident with the opening of the middle plate, and having a first attachment point in the indentation; and a second outer plate secured to the second portion of the elastomeric element and secured to the first outer plate at the indentation; wherein rotation of an item attached to the torsion spring at the first attachment point rotationally displaces the first outer plate and the second outer plate relative to the middle plate and stores energy in the elastomeric element; and wherein the torsion spring provides shear stress to the item when energy is stored in the elastomeric element and provides torque to the item when the elastomeric element returns to a neutral position. In one aspect, the elastomeric element comprises one or more polymers, or one or more rubbers. In another aspect, the middle plate comprises one or more spacers. In another aspect, the second outer plate comprises a second attachment point.

In some embodiments of the disclosure, a kit is disclosed as including a torsion spring including: a middle plate having a first attachment point displaced from a geometric center of the middle plate; one or more first elastomeric elements, wherein one of the first elastomeric elements proximate to a first side of the middle plate is secured to the first side of the middle plate and, and wherein the one or more first elastomeric elements has an opening coincident with the first attachment point of the middle plate; one or more second elastomeric elements, wherein one of the second elastomeric elements proximate to a second side of the middle plate is secured to the second side of the middle plate, and wherein the one or more second elastomeric elements has an opening coincident with the first attachment point of the middle plate; a first outer plate secured to one of the first elastomeric elements proximate to the first outer plate and having an opening coincident with the first attachment point of the middle plate; and a second outer plate secured to one of the second elastomeric elements proximate to the second outer plate and having an opening coincident with the attachment point of the middle plate; wherein rotation of an item attached to the torsion spring at the first attachment point rotationally displaces the middle plate relative to the first outer plate and the second outer plate and stores energy in the one or more first elastomeric elements and the one or more second elastomeric elements. In one aspect, the one or more first elastomeric elements or the one or more second elastomeric elements comprise one or more polymers or one or more rubbers. In another aspect, the first outer plate or the second outer plate comprises one or more spacers. In another aspect, the second outer plate comprises a second attachment point. In another aspect, the torsion spring further includes one or more shims, each shim having an elastic modulus value less than one or more elastic modulus values of the one or more first elastomeric elements or the one or more second elastomeric elements, each of the one or more shims disposed between two of the one or more first elastomeric elements or two of the one or more second elastomeric elements.

In some embodiments of the disclosure, a kit is disclosed as including a torsion spring including: a middle plate having an opening displaced from a geometric center of the middle plate; an elastomeric element having a first portion and a second portion, the first portion secured to a first side of the middle plate and the second portion secured to a second side of the middle plate, and the elastomeric element having an opening coincident with the opening of the middle plate; a first outer plate secured to the first portion of the elastomeric element, having an indentation coincident with the opening of the middle plate, and having a first attachment point in the indentation; a second outer plate secured to the second portion of the elastomeric element and secured to the first outer plate at the indentation; wherein rotation of an item attached to the torsion spring at the first attachment point rotationally displaces the first outer plate and the second outer plate relative to the middle plate and stores energy in the elastomeric element; and wherein the torsion spring provides shear stress to the item when energy is stored in the elastomeric element and provides torque to the item when the elastomeric element returns to a neutral position. In one aspect, the elastomeric element comprises one or more polymers, or one or more rubbers. In another aspect, the middle plate comprises one or more spacers. In another aspect, the second outer plate comprises a second attachment point.

In some embodiments of the disclosure, a method of designing a torsion spring is disclosed as including: providing a set of dimensions and a set of clearance distances of a space in which the torsion spring is required; providing one or more mechanical properties required of the torsion spring; determining a three-dimensional shape of a torsion spring and a position of an axis of rotation, wherein the axis of rotation is displaced from a geometric center of the torsion spring; determining a set of mechanical properties of one of more elastomeric elements to be used in the torsion spring; and determining a set of mechanical properties for one or more plates to be used in the torsion spring.

In addition to the foregoing, various other method, system, and apparatus aspects are set forth in the teachings of the present disclosure, such as the claims, text, and drawings forming a part of the present disclosure.

The foregoing is a summary and thus contains, by necessity, simplifications, generalizations, and omissions of detail. Consequently, those skilled in the art will appreciate that this summary is illustrative only and is not intended to be in any way limiting. There aspects, features, and advantages of the devices, processes, and other subject matter described herein will be become apparent in the teachings set forth herein.

BRIEF DESCRIPTION OF THE DRAWINGS

For a more complete understanding of the features and advantages of the present invention, reference is now made to the detailed description of the invention along with the accompanying figures, in which:

FIG. 6B shows a top view of the embodiment depicted in FIG. 6A.

FIG. 6C illustrates a cross-section of the embodiment shown in FIG. 6A.

FIG. 6D illustrates another cross-section of the embodiment shown in FIG. 6A.

FIG. 6J illustrates another view the embodiment of FIG. 6A displaced from its neutral position.

FIG. 6K illustrates another view the embodiment of FIG. 6A displaced from its neutral position.

DETAILED DESCRIPTION OF THE INVENTION

Illustrative embodiments of the system of the present application are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

FIGS. 1, 2, 3A, 3B, 4A, and 4B illustrate non-limiting examples of rotorcraft with which the present invention may be used.

Figure 1:
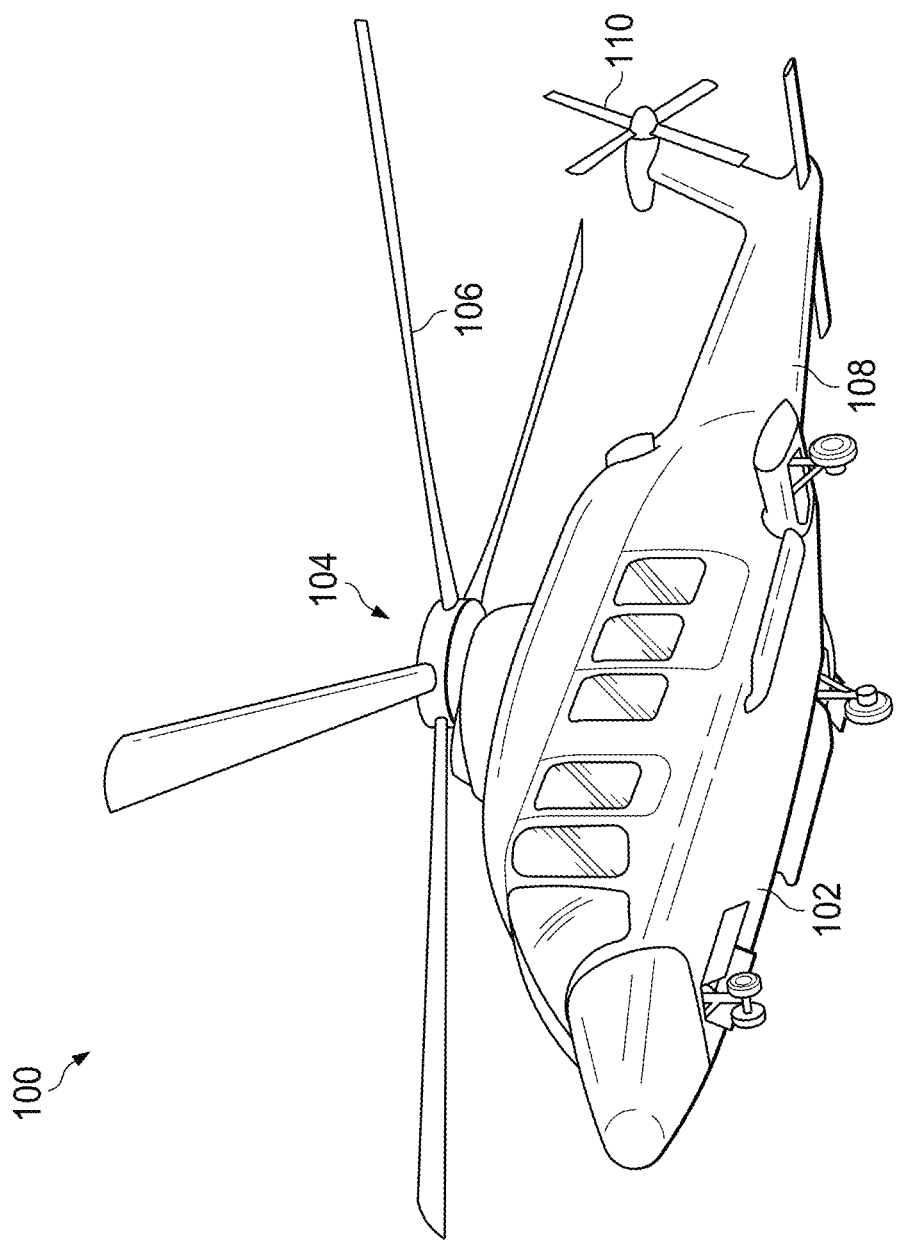
FIG. 1 shows a side view of a helicopter according to a particular embodiment of the present invention.

FIG. 1 shows an aircraft 100 in accordance with a preferred embodiment of the present application. In the exemplary embodiment, aircraft 100 is a helicopter having a fuselage 102 and a rotor system 104 carried thereon. A plurality of rotor blades 106 is operably associated with a rotor system 104 for creating flight. A tail boom 108 is depicted that further includes tail rotor 110.

Figure 2:
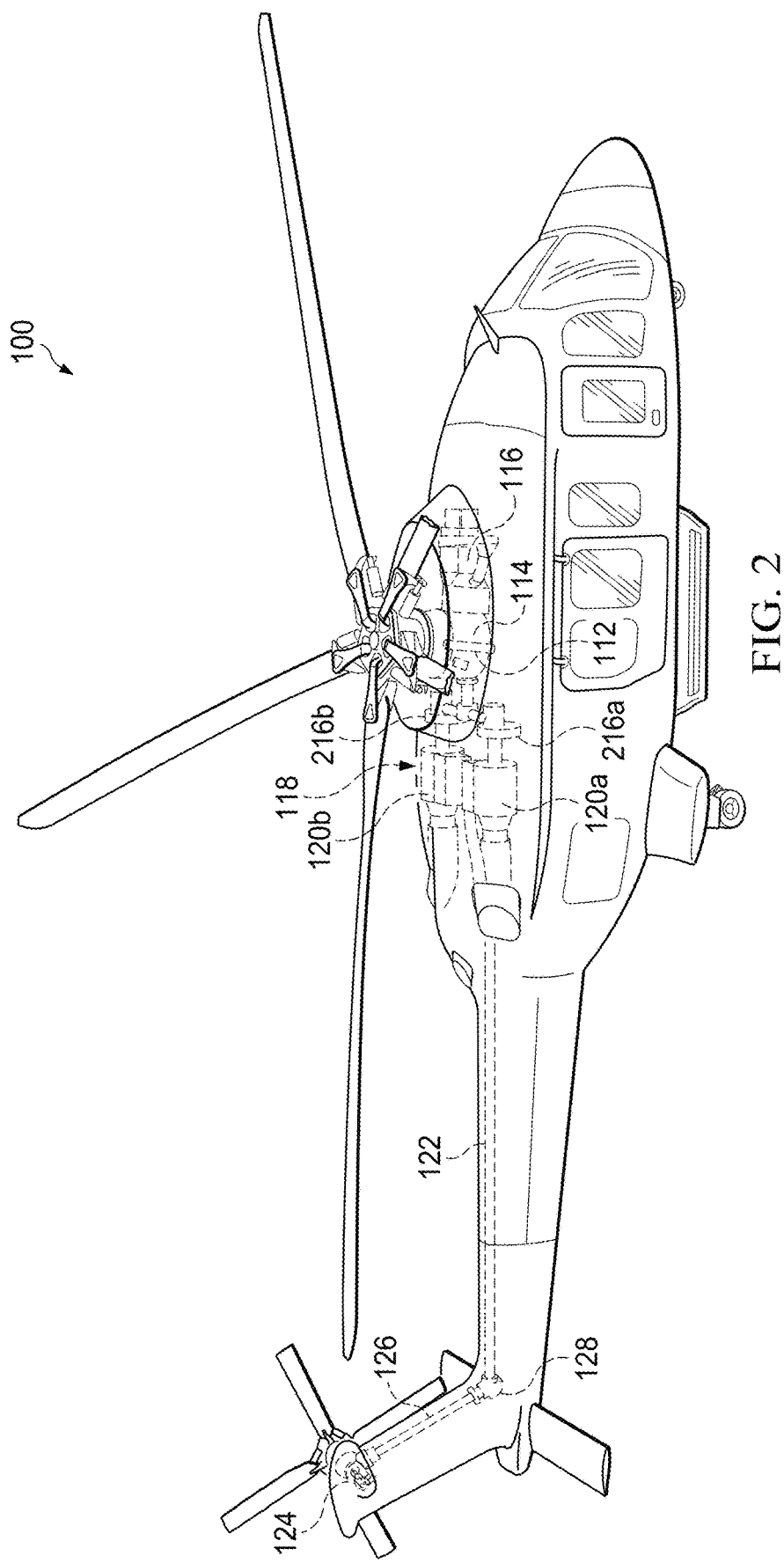
FIG. 2 shows a partial cross-section, perspective view of a helicopter according to an embodiment of the present invention.

For example, FIG. 2 shows a partial cross-section perspective view of aircraft 100 that includes additional detail of the present invention. Aircraft 100 further includes a rotor mast 112, which is connected to the main rotor gearbox 114 via a main rotor mast. The main rotor gearbox 114 is connected to one or more accessory gear boxes 116 and one or more reduction gearboxes 216a, 216b. Each reduction gearbox 216a, 216b is connected to one or more engines 120a, 120b, which are within an engine compartment 118. A tail rotor drive shaft 122 transmits mechanical rotation to the tail rotor gear box 124, which is connected via tail rotor drive shaft 126 and intermediate gear box 128.

Figure 3A:
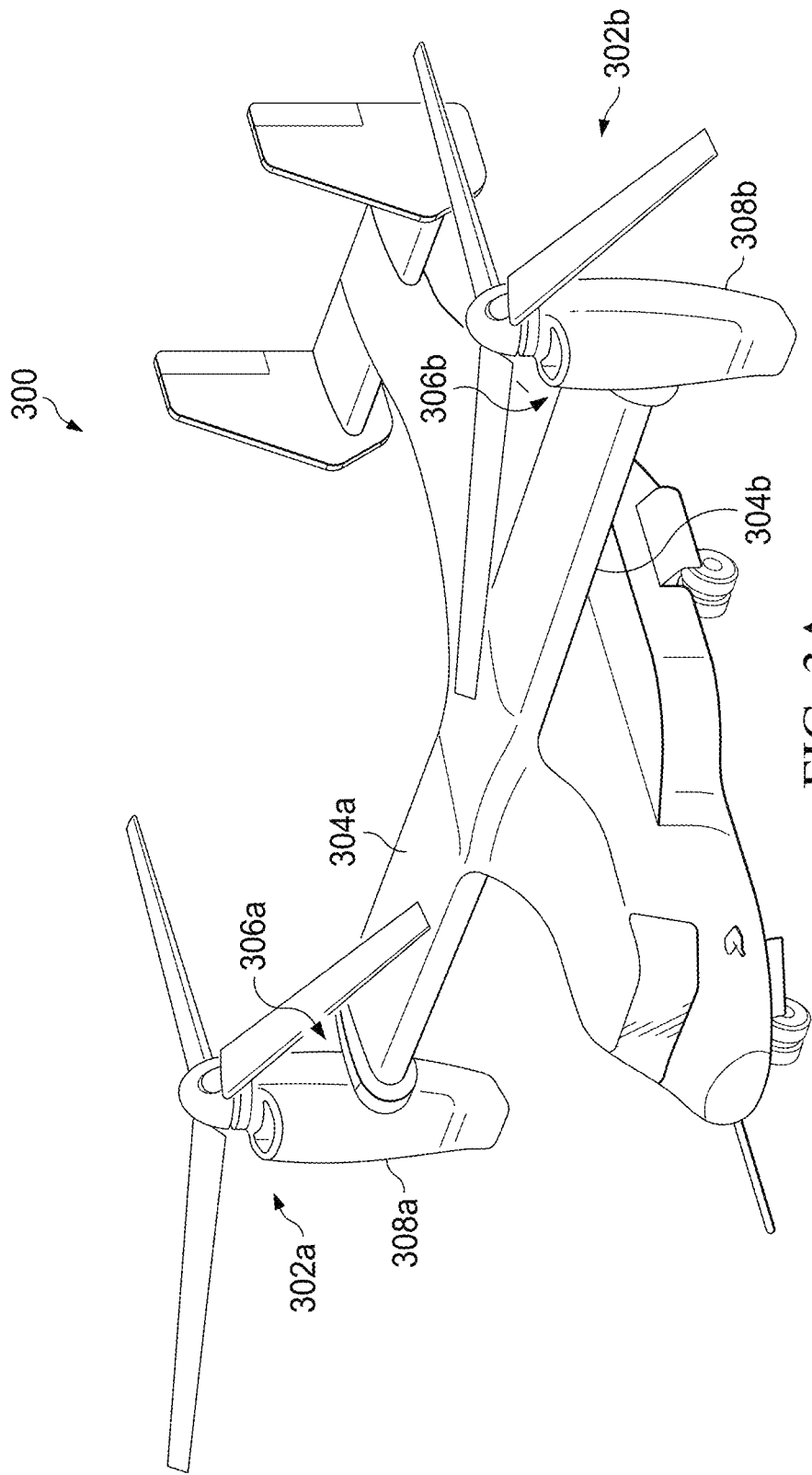
FIG. 3A shows a perspective view of a first tiltrotor aircraft in which the rotor system is in a takeoff-and-landing mode or hover mode according to a particular embodiment of the present invention.
Figure 3B:
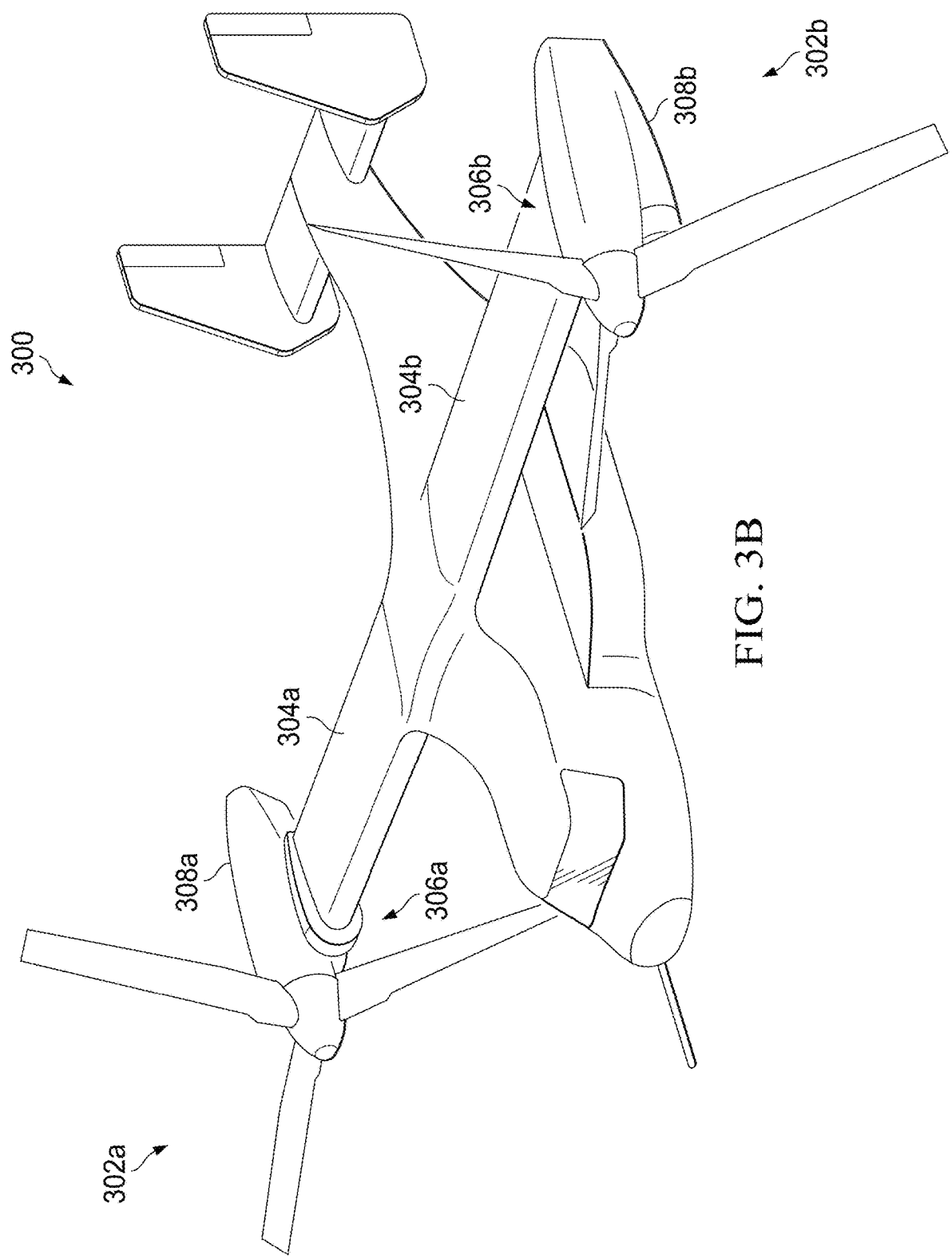
FIG. 3B shows a perspective view of the first tiltrotor aircraft in which the rotor system is in a cruise mode according to a particular embodiment of the present invention.

FIGS. 3A and 3B show a tiltrotor aircraft 300 that utilizes the system and methods in accordance with the present invention. FIG. 3A illustrates the tiltrotor aircraft 300 in takeoff-and-landing mode or hover mode, and FIG. 3B depicts the tiltrotor aircraft 300 in cruise mode. Tiltrotor aircraft 300 includes tiltrotor assemblies 302a and 302b that are carried by wings 304a and 304b, and are disposed at end portions 306a and 306b of wings 304a and 304b, respectively. Tiltrotor assemblies 302a and 302b include nacelles 308a and 308b, which carry the engines and transmissions of tiltrotor aircraft 300. Tiltrotor assemblies 302a and 302b move or rotate relative to wings 304a and 304b between a helicopter or hover mode in which tiltrotor assemblies 302a and 302b are tilted upward, such that tiltrotor aircraft 300 flies like a conventional helicopter; and an airplane or cruise mode in which tiltrotor assemblies 302a and 302b are tilted forward, such that tiltrotor aircraft 300 flies like a conventional propeller driven aircraft.

Figure 4A:
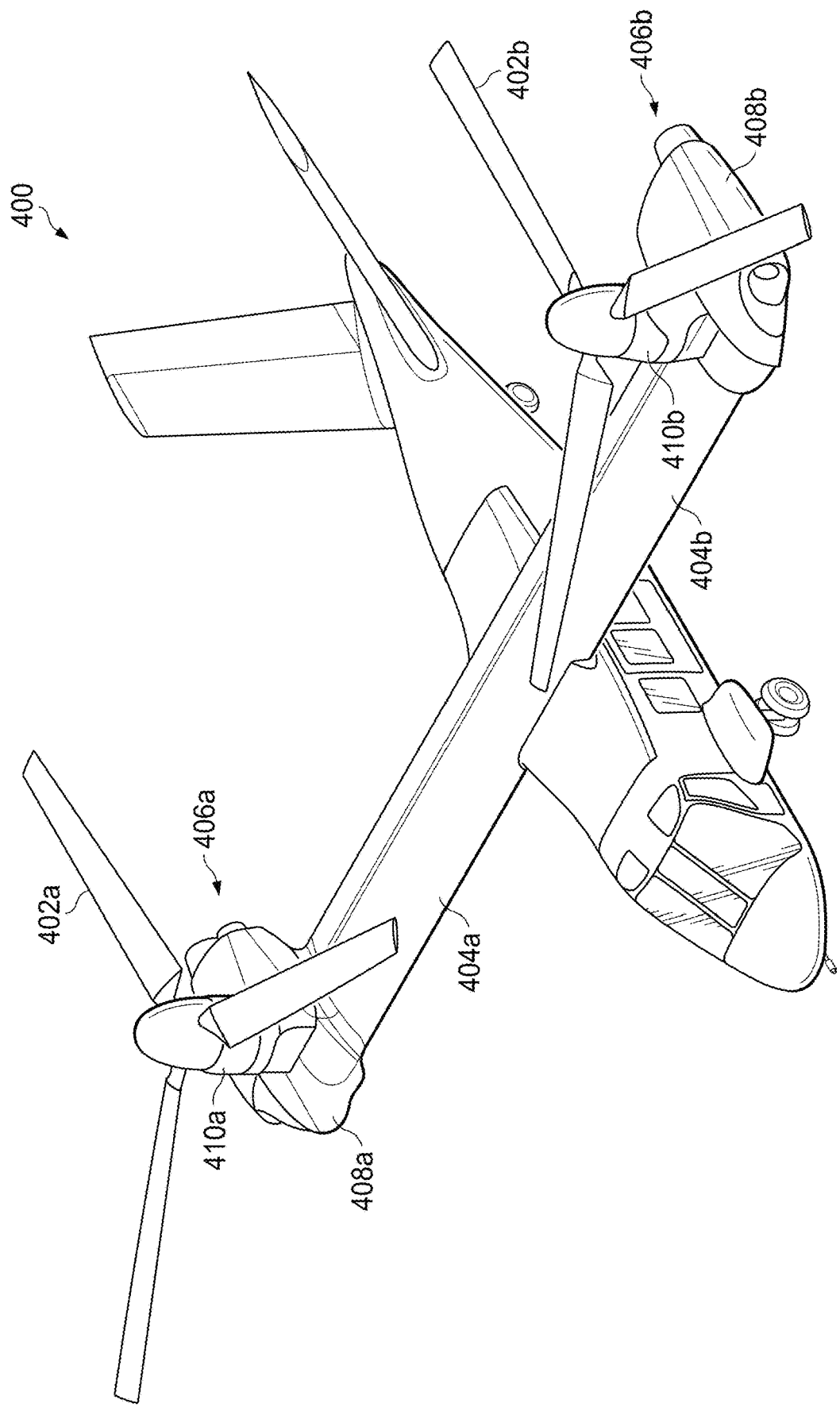
FIG. 4A shows a perspective view of a second tiltrotor aircraft in which the rotor system is in a takeoff-and-landing mode or hover mode according to a particular embodiment of the present invention.
Figure 4B:
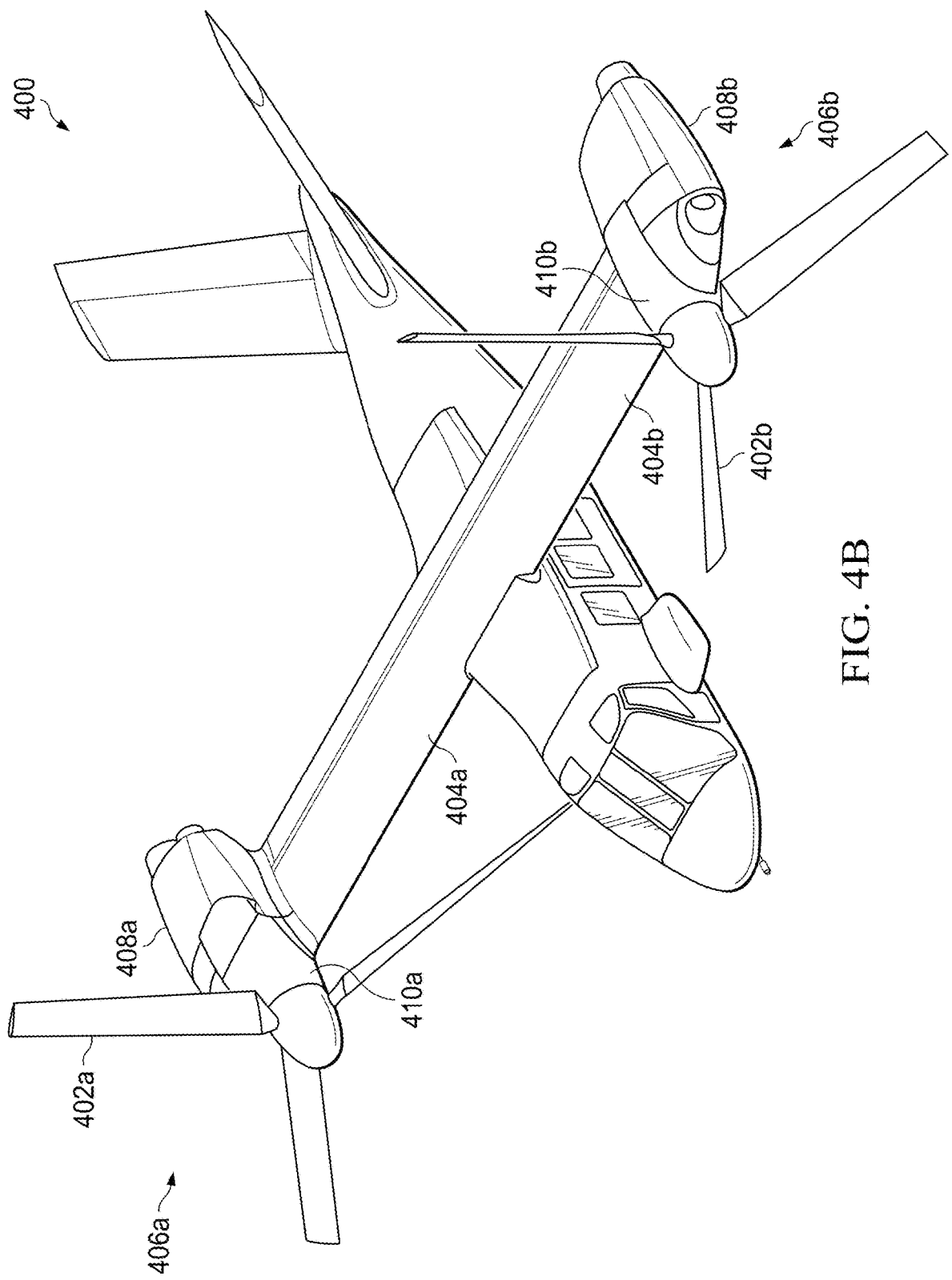
FIG. 4B shows a perspective view of the second tiltrotor aircraft in which the rotor system is in a cruise mode according to a particular embodiment of the present invention.

FIGS. 4A and 4B show another tiltrotor aircraft 400 that utilizes the system and methods in accordance with the present invention. FIG. 4A depicts the tiltrotor aircraft 400 in takeoff-and-landing mode or hover mode, and FIG. 4B illustrates the tiltrotor aircraft 400 in cruise mode. Tiltrotor aircraft 400 includes tiltrotor assemblies 402a and 402b that are carried by wings 404a and 404b, and are disposed at end portions 406a and 406b of wings 404a and 404b, respectively. Tiltrotor assemblies 402a and 402b include nacelles 408a and 408b, which include the engines and transmissions of tiltrotor aircraft 400. In this embodiment, the engines are fixed to the wing and do not rotate, rather, only the pylons 410a and 410b with the tiltrotor assemblies 402a and 402b rotate. Tiltrotor assemblies 402a and 402b move and rotate relative to wings 404a and 404b and the nacelles 408a and 408b. The tiltrotor assemblies 402a and 402b do not more relative to the wings 404a and 404b. Instead, during the transition between a helicopter or hover mode only the pylons 410a and 410b with the tiltrotor assemblies 402a and 402b rotate to redirect the thrust from the tiltrotor assemblies 402a and 402b. The tiltrotor aircraft 400 is still able to fly like a conventional helicopter; and an airplane or cruise mode in which one of the rotors are tilted forward, such that tiltrotor aircraft 400 flies like a conventional propeller driven aircraft.

Figure 5A:
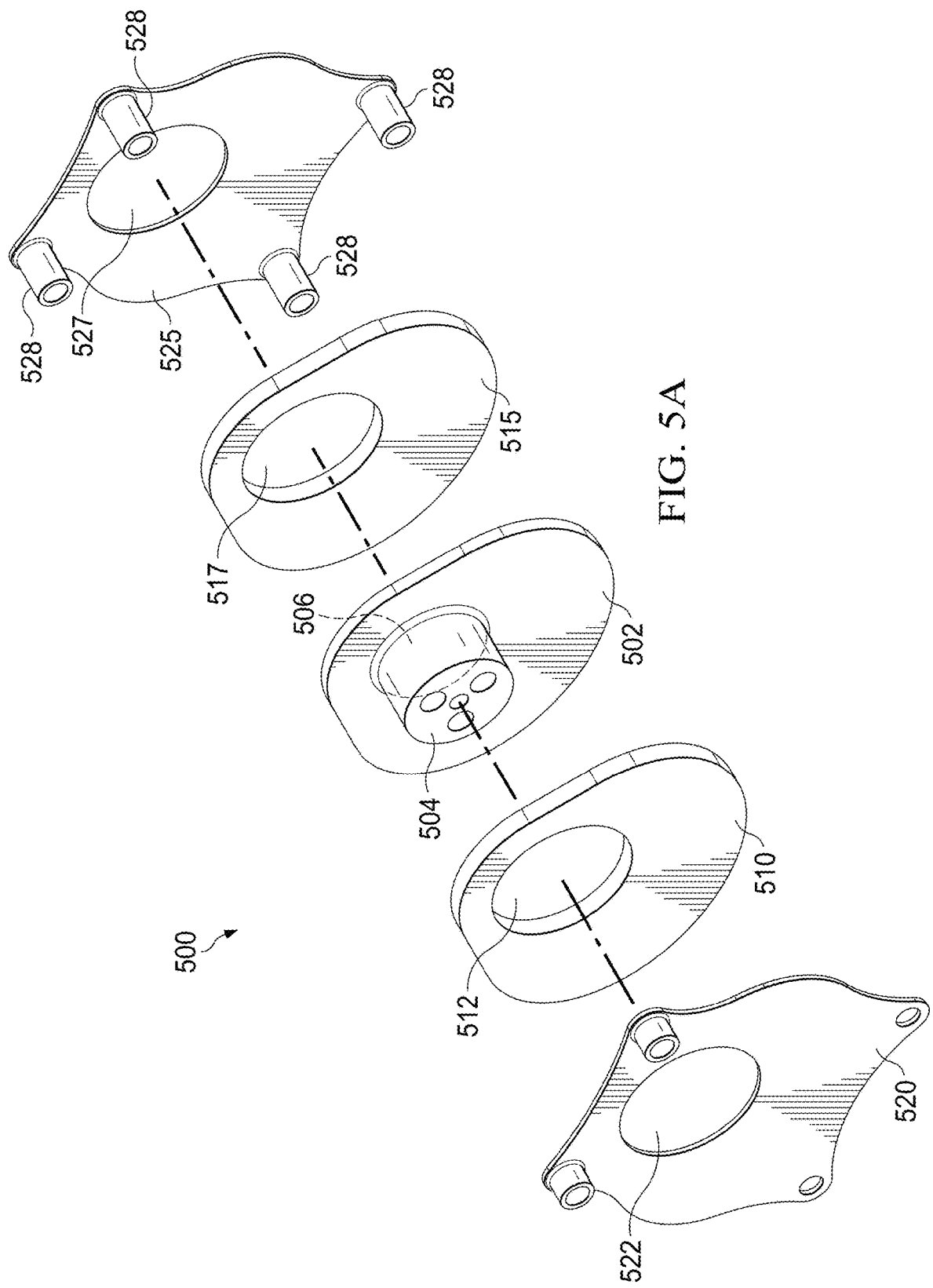
FIG. 5A shows an exploded view of an embodiment of the present invention.
Figure 5B:
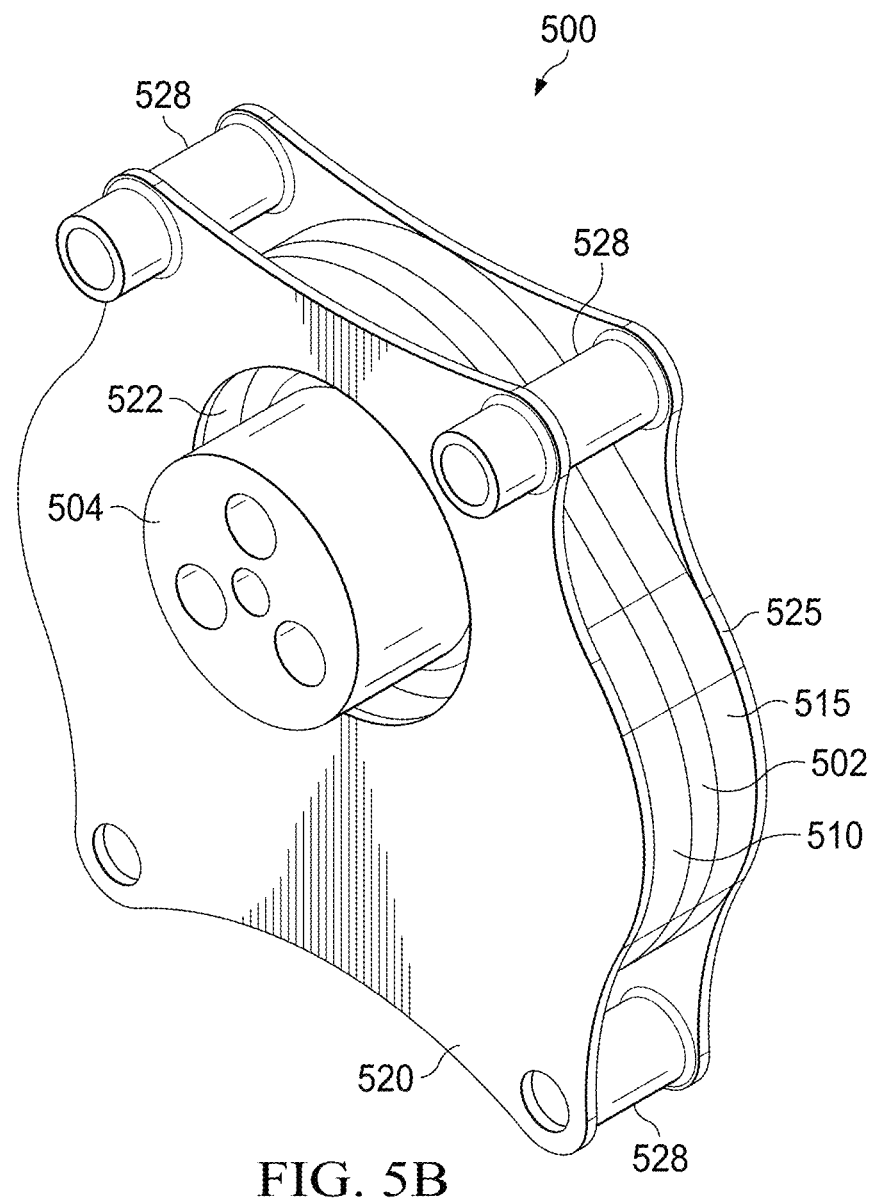
FIG. 5B illustrates a perspective view of the embodiment shown in FIG. 5A.

FIGS. 5A and 5B illustrate views of an embodiment of the present invention. FIG. 5A is an exploded view of the torsion spring 500. FIG. 5B is a perspective view of the torsion spring 500. The torsion spring 500 includes a middle plate 502. The middle plate also includes a first attachment point 504 on a first side of the middle plate 502 and configured to protrude through openings provided for it. The first attachment point 504 is placed asymmetrically on the middle plate 502, away from the geometric center on the middle plate 502. The middle plate may also include a second attachment point 506 on a second side of the middle plate 502. The first and second attachment points may be used to attach objects to the middle plate 502.

The torsion spring 500 includes one or more first elastomeric elements 510 and one or more second elastomeric elements 515. Herein, an "elastomeric element" may also be called an "elastomer" or an "elastomeric package." One of each of a first elastomeric element 510 and a second elastomeric element 515 is shown for simplicity of illustration. The first and second elastomeric elements 510, 515, respectively, may include one or more polymers or one or more rubbers such as butyl rubber, nitrile rubber, or silicone rubber. The first elastomeric element 510 may be bonded, vulcanized, or otherwise secured to a first side of the middle plate 502, and the second elastomeric element may be bonded, vulcanized, or otherwise secured to a second side of the middle plate 502. The first elastomeric element 510 has a first opening 512 for the first attachment point 504. The second elastomeric element 515 may have an opening 517 for the second attachment point 506.

Generally, the torsion spring 500 includes one or more first elastomeric elements 510, wherein one of the one or more first elastomeric elements 510 proximate to a first side of the middle plate 502 is secured to the first side of the middle plate 502, and wherein the one or more first elastomeric elements 510 have first openings 512 coincident with the first attachment point of the middle plate 502. Also, generally, the torsion spring 500 includes one or more second elastomeric elements 515, wherein one of the one or more second elastomeric elements 515 proximate to a second side of the middle plate 502 is secured to the second side of the middle plate 502 and wherein the one or more second elastomeric elements 515 have openings 517 coincident with the first attachment point of the middle plate 502.

The torsion spring 500 also includes a first outer plate 520 and a second outer plate 525. The first outer plate may be bonded, vulcanized, or otherwise secured to the first elastomeric element 510, and the second outer plate 525 may be bonded, vulcanized, or otherwise secured to the second elastomeric element 515. The first outer plate 520 has an opening 522 for the first attachment point 504. The second outer plate 525 may have an opening 527 for the second attachment point 506. One or both of the first and second outer plates 520, 525 may have spacers 528 to attach the plates to each other at a desired distance.

The end of an item, e.g., a shaft or a rod in a rotorcraft drive system, may be attached to the torsion spring 500 at the first attachment point 504. When the rod is twisted, the middle plate 502 is rotationally displaced around the rotation axis of the rod. The rotational displacement of the middle plate 502 displaces the first elastomeric element 510 and the second elastomeric element 515. Displacing the first elastomeric element 510 and the second elastomeric element 515 stores energy in them, but asymmetrically. Before the rod is released, the torsion spring 500 delivers a shear stress to the rod. When the rod is allowed to rotate, the torsion spring 500 exerts a torque on the rod as the first elastomeric element 510 and second elastomeric element 515 return to their neutral positions and the shear stress decreases to zero.

A shim may be used between any given pair of the one or more first elastomeric elements or any given pair of the one or more second elastomeric elements. Such a shim, having an elastic modulus value less than one or more elastic modulus values of the one or more first elastomeric elements or the one or more second elastomeric elements, may be used to adjust the directional stiffness and/or strains of the torsion spring 500. Such a shim may be metallic.

Placement of one or more attachment points away from a geometrical center of a torsion spring may be used to many shapes besides the non-limiting example described in detail herein, such as flat pads, radial/journals/spherical rod ends, or conicals.

FIG. 5B is a perspective view of the torsion spring 500. FIG. 5B depicts the middle plate 502, the first attachment point 504, the first elastomeric element 510, the second elastomeric element 515, the first outer plate 520, the opening 522, the second outer plate 525, and the spacers 528.

Figure 6A:
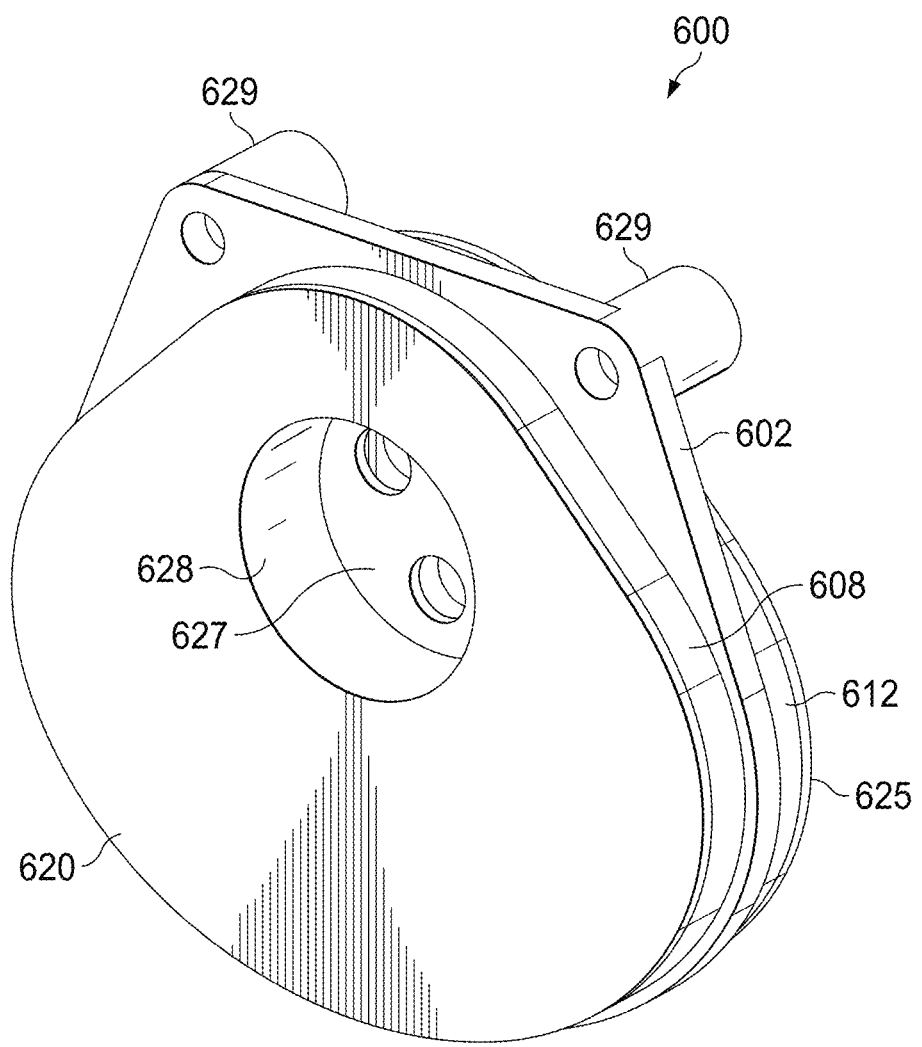
FIG. 6A depicts a perspective view of another embodiment of the present invention.

FIGS. 6A and 6B illustrate another embodiment of the present invention. FIG. 6A is a perspective view of the torsion spring 600, and FIG. 6B is a top view of the torsion spring 600. FIGS. 6C and 6D are cross-sectional views of the torsion spring 600.

FIG. 6A depicts the torsion spring 600, showing middle plate 602. Also shown are the first portion 608 of elastomeric element 610, the second portion 612 of elastomeric element 610, the first outer plate 620, the second outer plate 625, and spacers 629. The elastomeric element 610 may include one or more polymers or one or more rubbers such as butyl rubber, nitrile rubber, or silicone rubber. The first attachment point 627 is included in an indentation 628 in the first outer plate 620 coincident with an opening in the middle plate 602 that is displaced from a geometric center of the middle plate 602. The second outer plate 625 may also have a second attachment point (not shown) proximate to the indentation 628. Each of the middle plate 602, the first portion 608 of elastomeric element 610, and the second portion 612 of elastomeric element 610, have openings coincident with the indentation 628 and the first attachment point 627 of the first outer plate 620. FIG. 6B shows a top view of the torsion spring 600, illustrating the middle plate 602, the first attachment point 627, and the first outer plate 620.

FIG. 6C is a cross-section of the torsion spring 600. FIG. 6C shows the middle plate 602, the elastomeric element 610 with first portion 608 and the second portion 612 bonded, vulcanized, or otherwise secured to the middle plate 602. The middle plate 602 and the elastomeric element 610 are contained within the first outer plate 620 and the second outer plate 625, which are bonded, vulcanized, or otherwise secured together near first attachment point 627 at the indentation 628. One embodiment includes bonding shims (not shown) between first portion 608 and first outer plate 620; between first portion 608 and middle plate 602; between second portion 612 and middle plate 602; or between second portion 612 and second outer plate 625. The use of bonding shims is only one manufacturing option, however; the bonding shims may be used but are not required for the present invention. Spacers 629 are also shown.

FIG. 6D is another cross-section of the torsion spring 600. FIG. 6D shows the middle plate 602, the elastomeric element 610 with first portion 608 and the second portion 612 bonded, vulcanized, or otherwise secured to the middle plate 602. The middle plate 602 and the elastomeric element 610 are contained within the first outer plate 620 and the second outer plate 625, which are bonded, vulcanized, or otherwise secured together near first attachment point 627 at the indentation 628. A spacer 629 is also shown.

The end of an item, e.g., a rod, may be attached to the torsion spring 600 at the first attachment point 627. When the rod is twisted, the first outer plate 620 and the second outer plate 625, to which it is attached, are rotationally displaced around the rotation axis of the rod. The rotational displacement of the first outer plate 620 and the second outer plate 625 displaces the first portion 608 and the second portion 612 of the elastomeric element 610, asymmetrically storing energy in them. Before the rod is released, the torsion spring 600 delivers a shear stress to the rod. When the rod is allowed to rotate, the torsion spring 600 exerts a torque on the rod as the first portion 608 and the second portion 612 of the elastomeric element 610 return to their neutral positions and the shear stress decreases to zero.

Figure 6E:
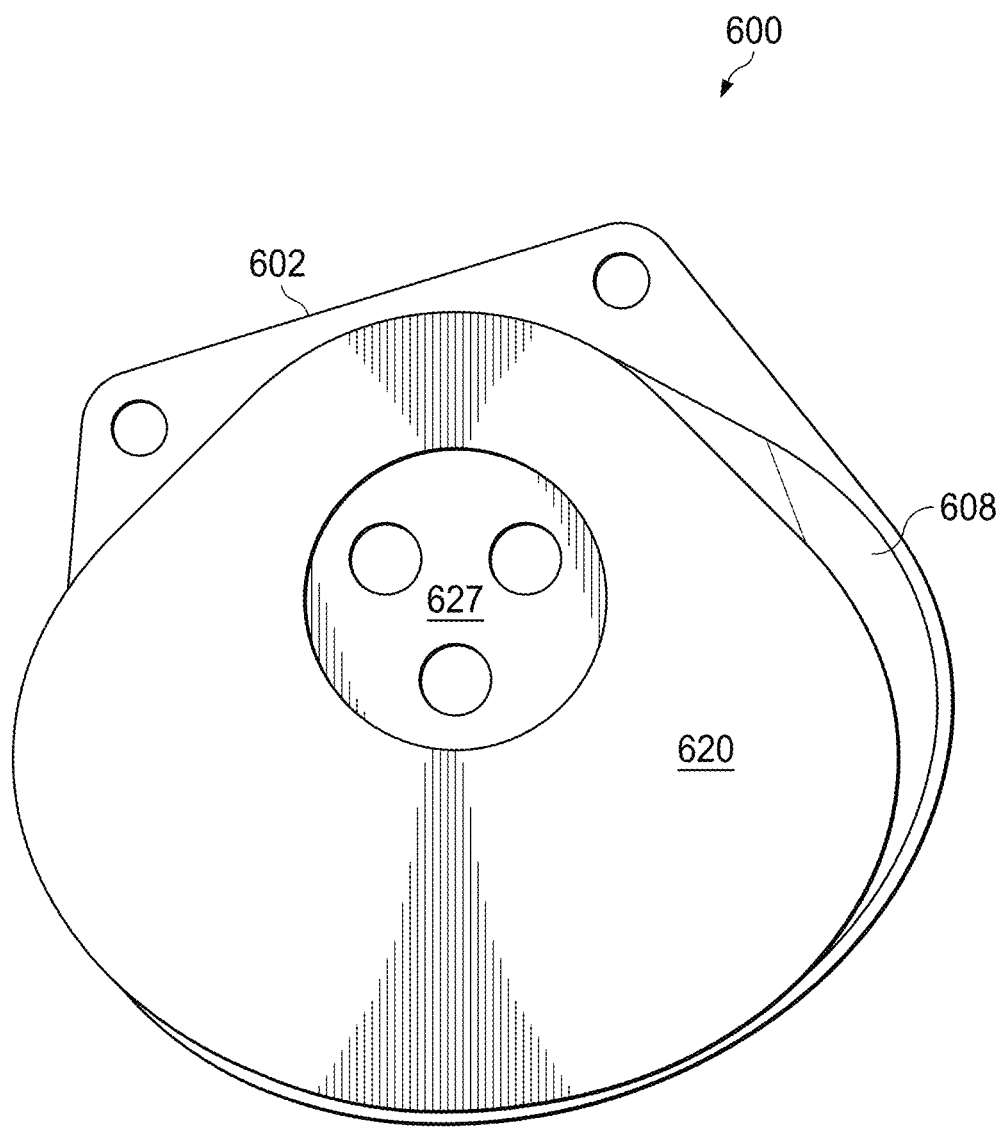
FIG. 6E illustrates the embodiment of FIG. 6A displaced from its neutral position.

FIGS. 6E-6M illustrate torsion spring 600 displaced from its neutral position. FIG. 6E is a view of torsion spring 600 showing first outer plate 620 and first portion 608 of elastomeric element 610 with the torsion spring displaced as indicated by the acute angle. Also shown are middle plate 602 and first attachment point 627.

Figure 6F:
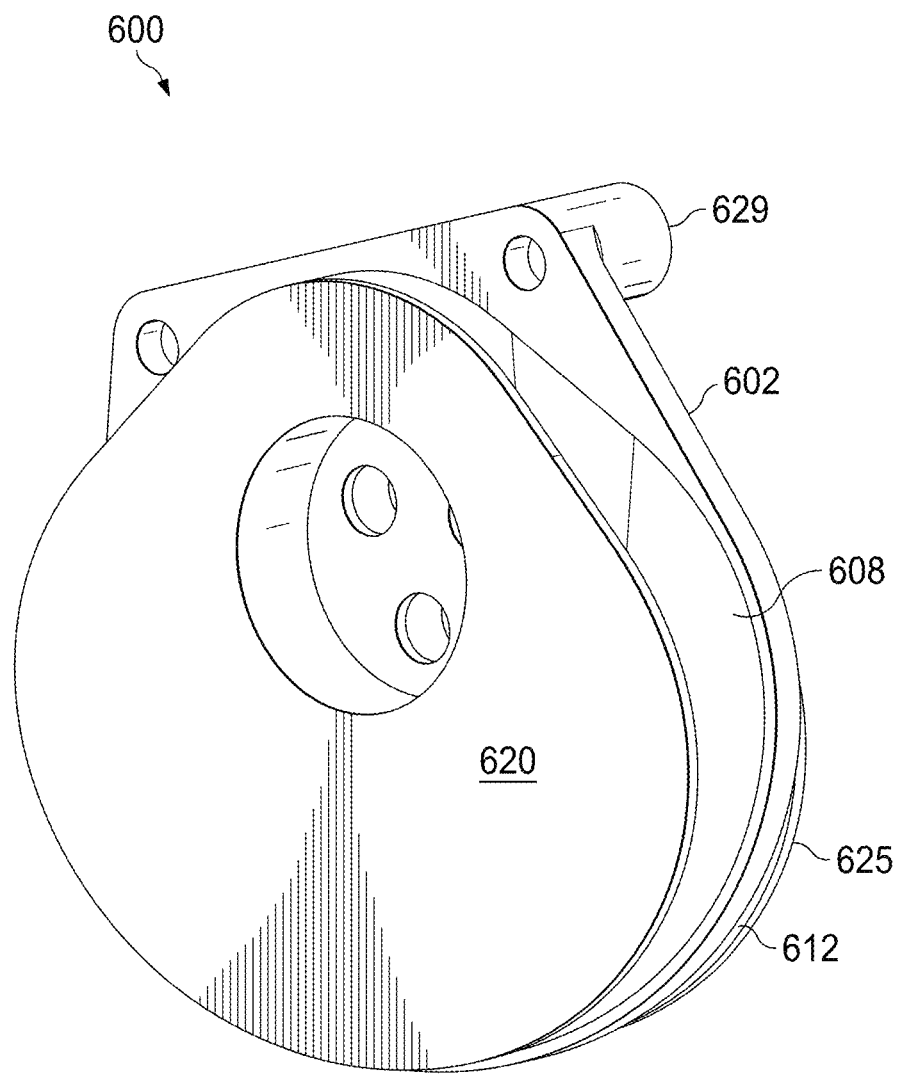
FIG. 6F illustrates another view the embodiment of FIG. 6A displaced from its neutral position.
Figure 6G:
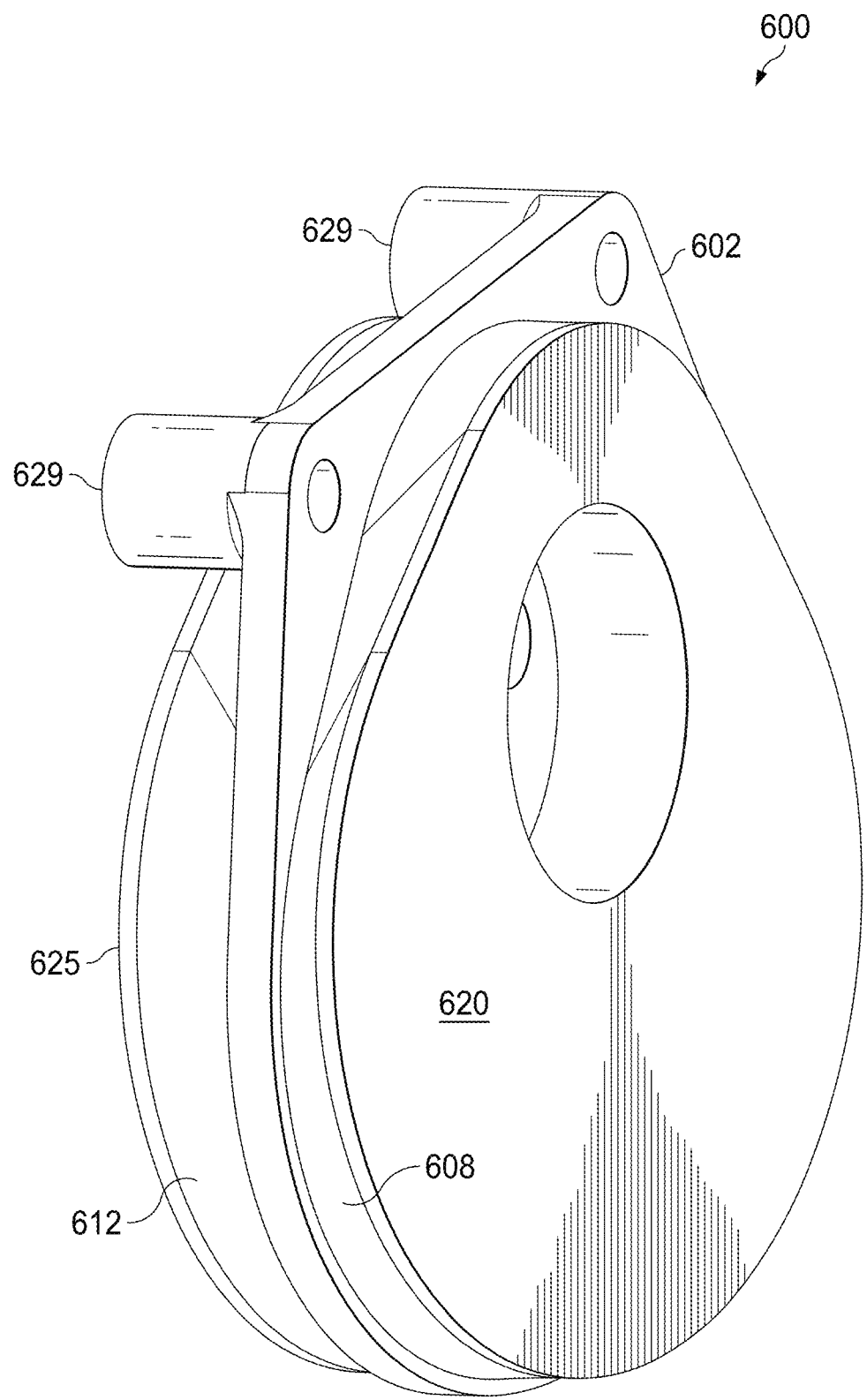
FIG. 6G illustrates another view the embodiment of FIG. 6A displaced from its neutral position.

FIG. 6F shows a side view of the displaced torsion spring 600 of FIG. 6E, illustrating first outer plate 620. First portion 608, middle plate 602, second portion 612, second outer plate 625, and a spacer 629. FIG. 6G shows the opposite side view of the displaced torsion spring of FIGS. 6E and 6F showing all of the same items illustrated in FIG. 6F plus another spacer 629.

Figure 6H:
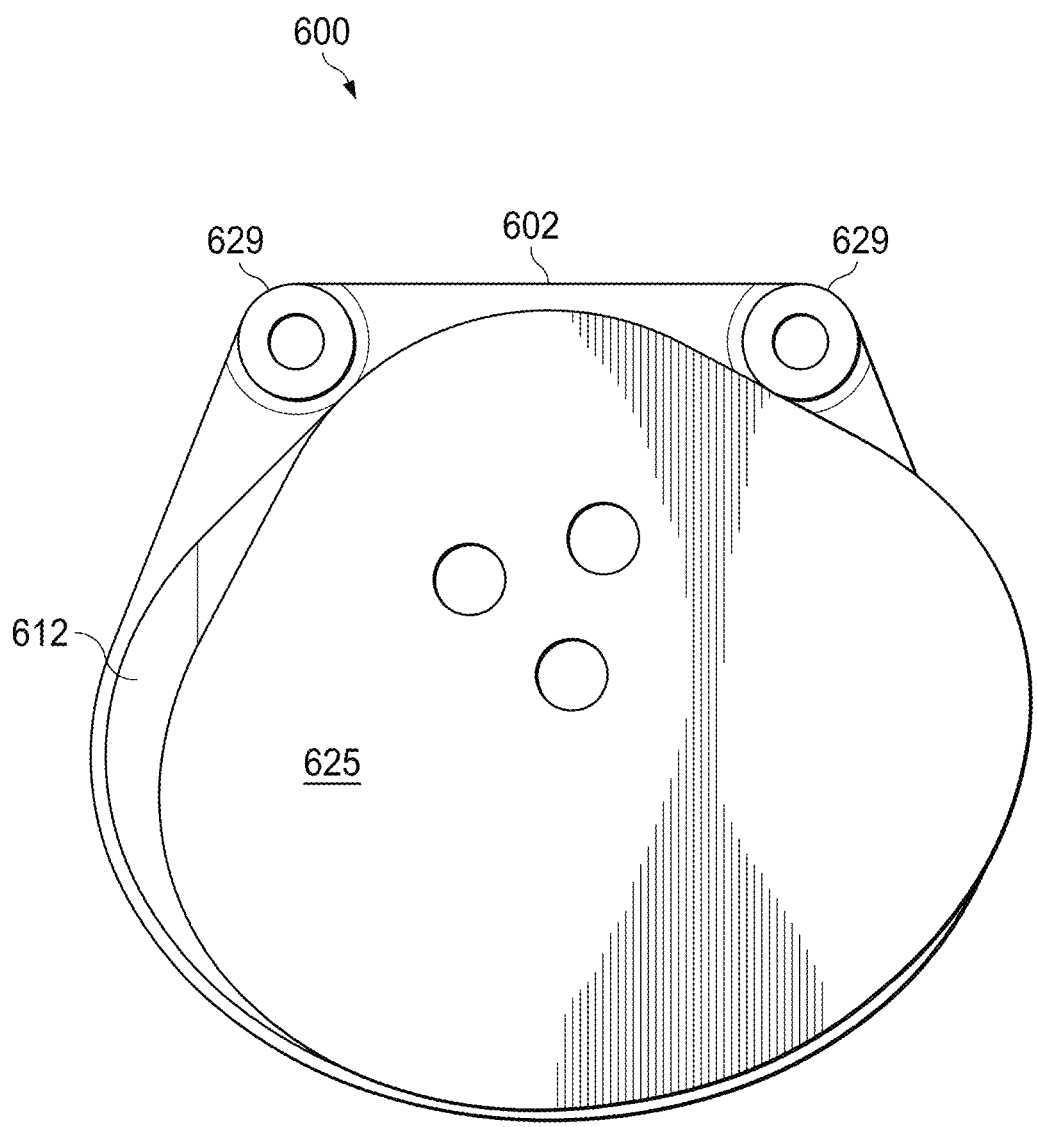
FIG. 6H illustrates another view the embodiment of FIG. 6A displaced from its neutral position.
Figure 6I:
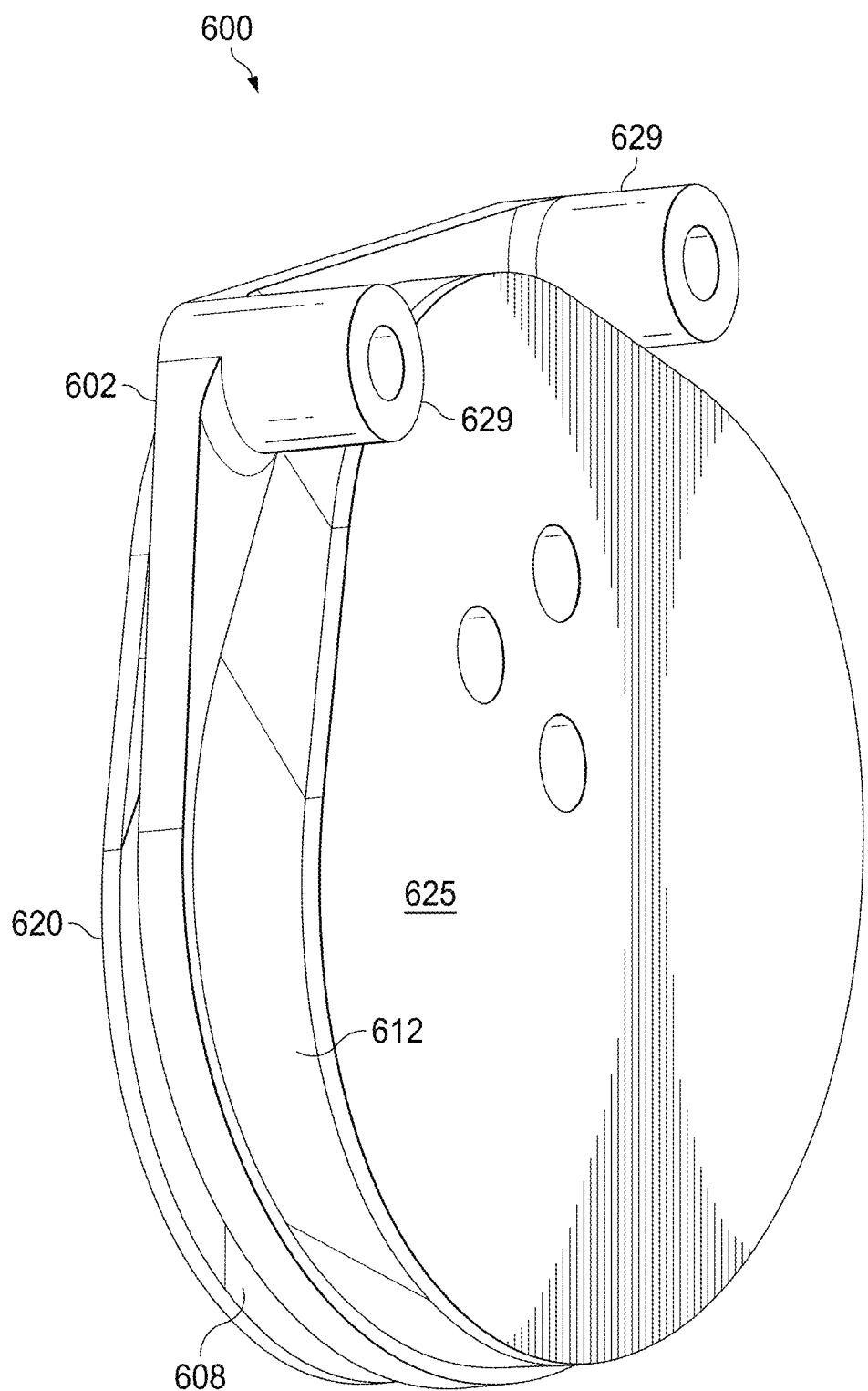
FIG. 6I illustrates another view the embodiment of FIG. 6A displaced from its neutral position.

FIG. 6H depicts the displaced torsion spring 600 of FIG. 6E from the side opposite that shown in FIG. 6E. In this view, second outer plate 625, second portion 612, middle plate 602, and two spacers 629 as visible. FIG. 6I illustrates a view of displaced torsion spring 600 that shows second outer plate 625, second portion 612, middle plate 602, first portion 608, first outer plate 620 and two spacers 629.

FIGS. 6J and 6K illustrate the displaced torsion spring 600 from the top and bottom edges, with both figures showing first outer plate 620, first portion 608, middle plate 602, second portion 612, second outer plate 625, and two spacers 629. In FIG. 6J, the torsion spring 600 is oriented with second outer plate 625 up. In FIG. 6K, the torsion spring 600 is oriented with first outer plate 620 up.

Figure 6M:
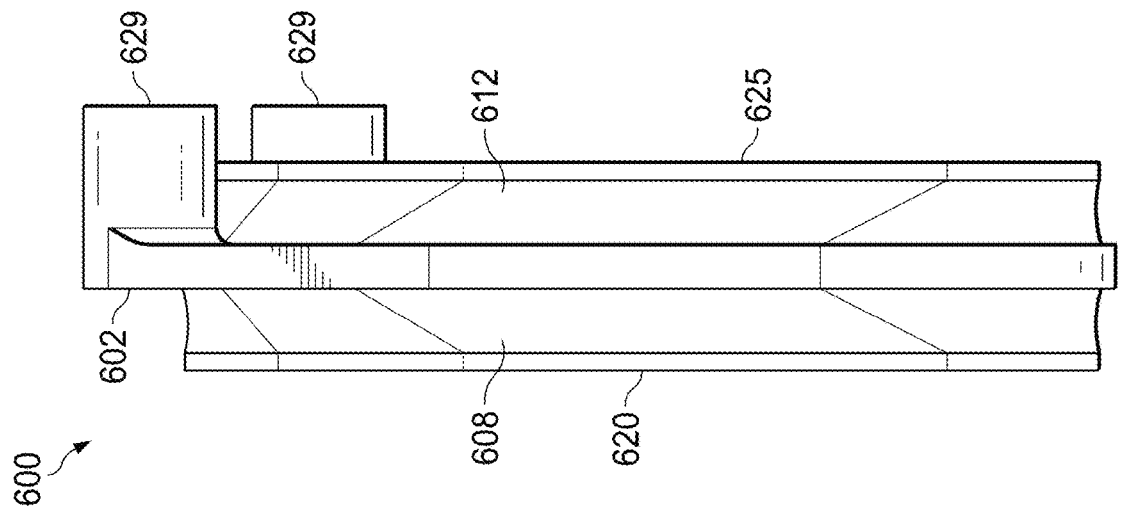
FIG. 6M illustrates another view the embodiment of FIG. 6A displaced from its neutral position.
Figure 6L:
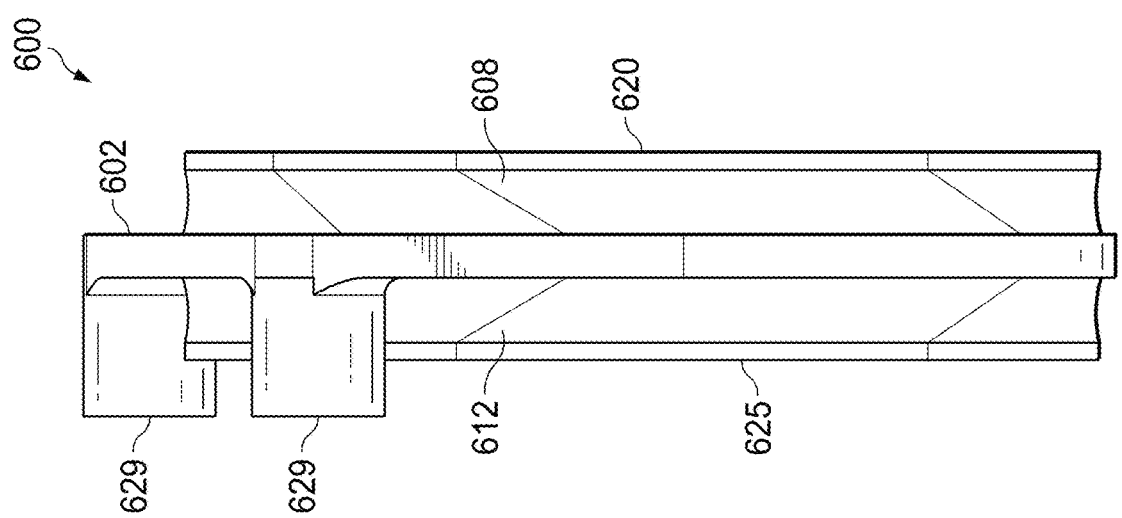
FIG. 6L illustrates another view the embodiment of FIG. 6A displaced from its neutral position.

FIGS. 6L and 6M illustrate the displaced torsion spring 600 from the side edges, with both figures showing first outer plate 620, first portion 608, middle plate 602, second portion 612, second outer plate 625, and two spacers 629.

Figure 7A:
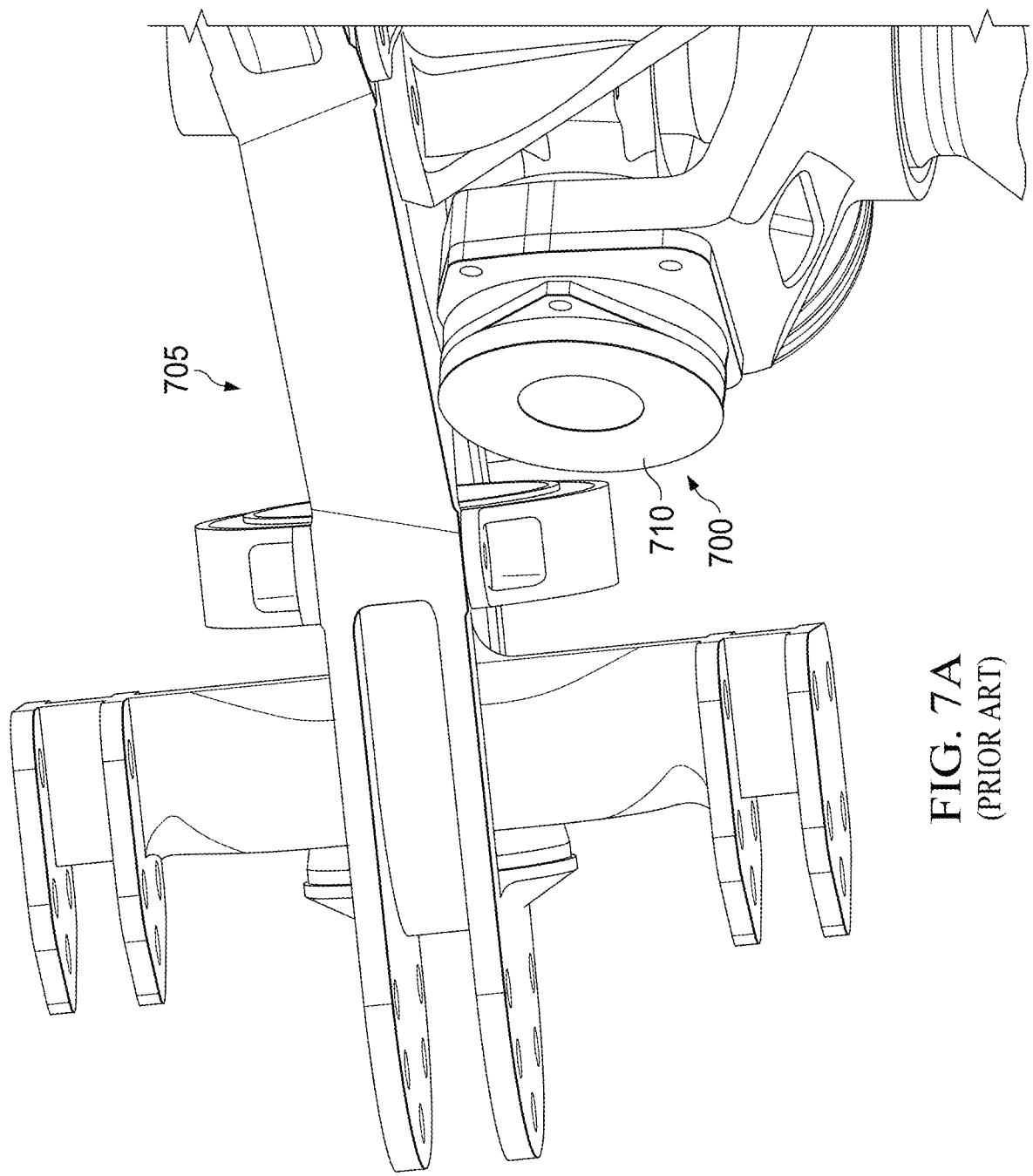
FIG. 7A illustrates a prior art torsion spring in a limited space in a rotor hub assembly.

FIG. 7A illustrates a prior art torsion spring 700 in a limited space in a rotor hub assembly 705. When the rotor hub assembly 705 is tilted as shown, it impacts the prior art torsion spring 700 at area 710, an undesirable event that adversely impacts the operation of the prior art torsion spring 700 and rotor hub assembly 705.

Figure 7B:
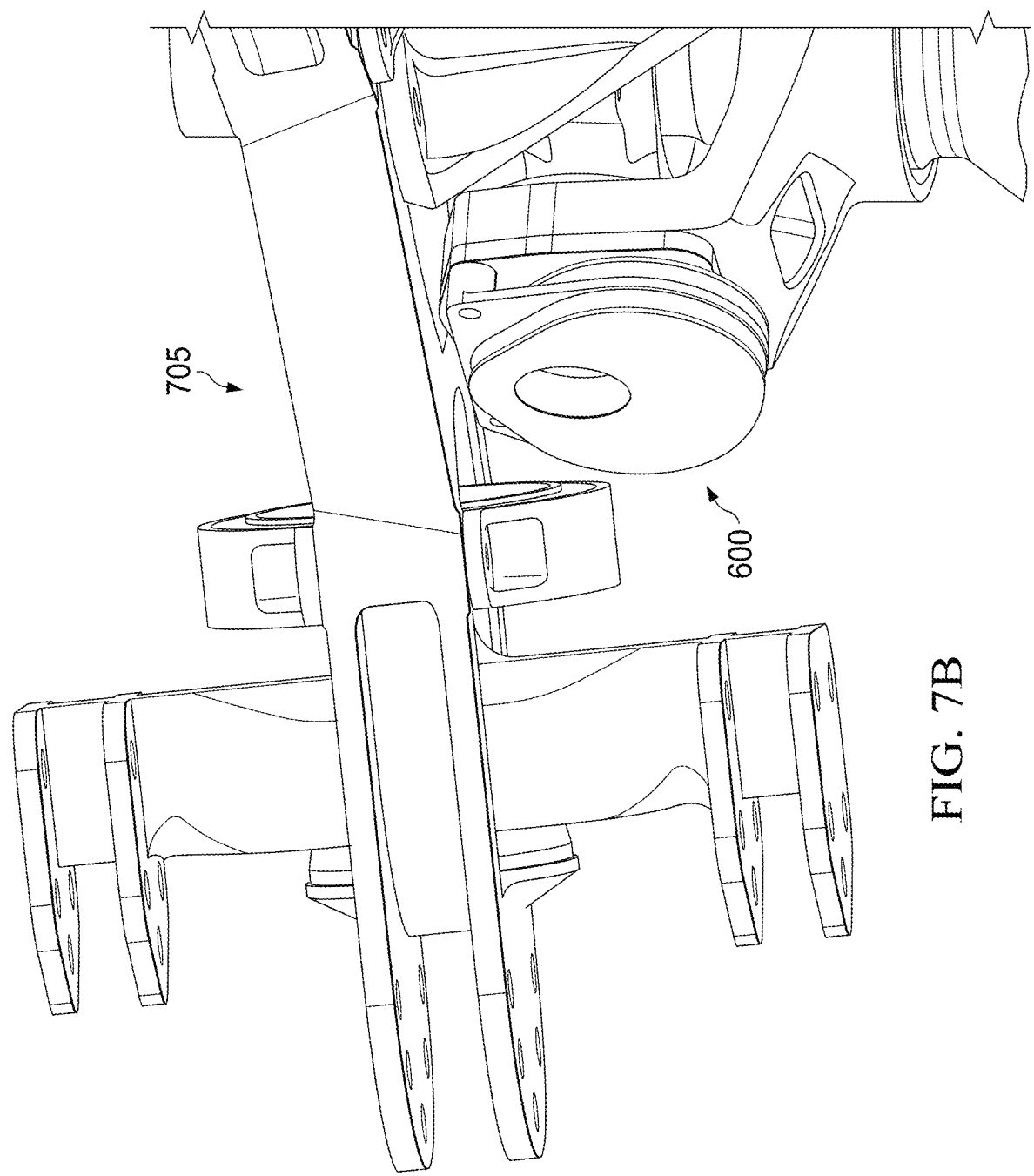
FIG. 7B depicts the embodiment of FIG. 6A in a limited space in a rotor hub assembly.

FIG. 7B depicts the torsion spring 600, an embodiment of the invention, in a limited space in the rotor hub assembly 705. When the rotor hub assembly is tilted as shown, it does not impact the torsion spring 600.

Figure 8:
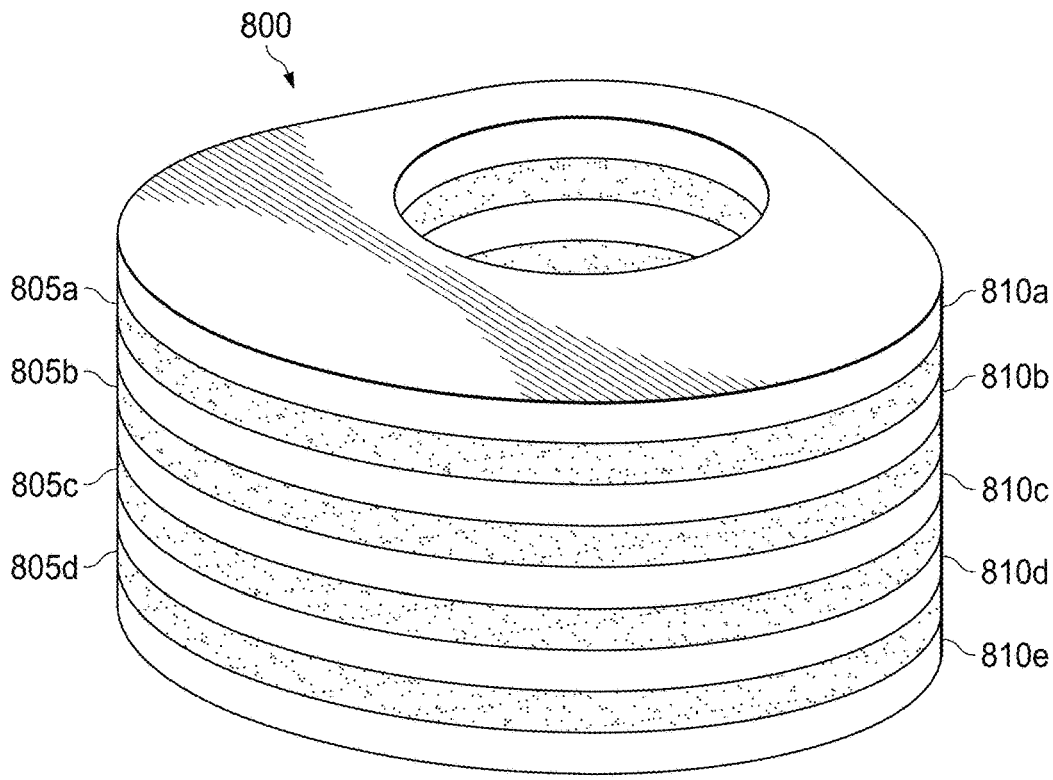
FIG. 8 shows a portion of a torsion spring that includes elastomeric elements with metallic shims.

FIG. 8 shows a portion of a torsion spring 800 that includes elastomeric elements 805a-805g with metallic shims 810a-810d between and on either side of the elastomeric layers 805a-805e. While the portion of the torsion spring 800 is illustrated with multiple elastomeric elements 805a-805d and multiple metallic shims 810a-810d, the skilled artisan will recognize that the torsion spring may be formed with one or more such elastomeric elements and one or more such metallic shims. In addition, each of the shims 810a-810d may include an adhesive between the shim and an adjacent elastomeric element 805a-805d or other adjacent component, such as a middle plate or an outer plate. Each of the shims 810a-810d may interact via mechanical compression with an adjacent component without the use of an adhesive. Further, the shims and or elastomeric bearings can vary in mechanical properties (e.g., thickness, strength, density, stiffness, torsion, stress, strain, etc.), among layers. Generally, a torsion spring such as torsion spring 500 or torsion spring 600 is sized considering a number of factors, including manufacturing considerations, stiffness, strains due to loads and motions, and the envelope in which a bearing is to be used.

It should be noted that the shape of an antisymmetric torsion spring such as torsion spring 500 or torsion spring 600 may be shaped to be elongated along the axis including the attachment point or points and the geometric center of the torsion spring 500 or the torsion spring 600, making the torsion spring 500 or the torsion spring 600 oblong in shape, and such elongation increases the stiffness of the spring.

The torsion spring 500 or the torsion spring 600 may be included in a kit.

Figure 9:
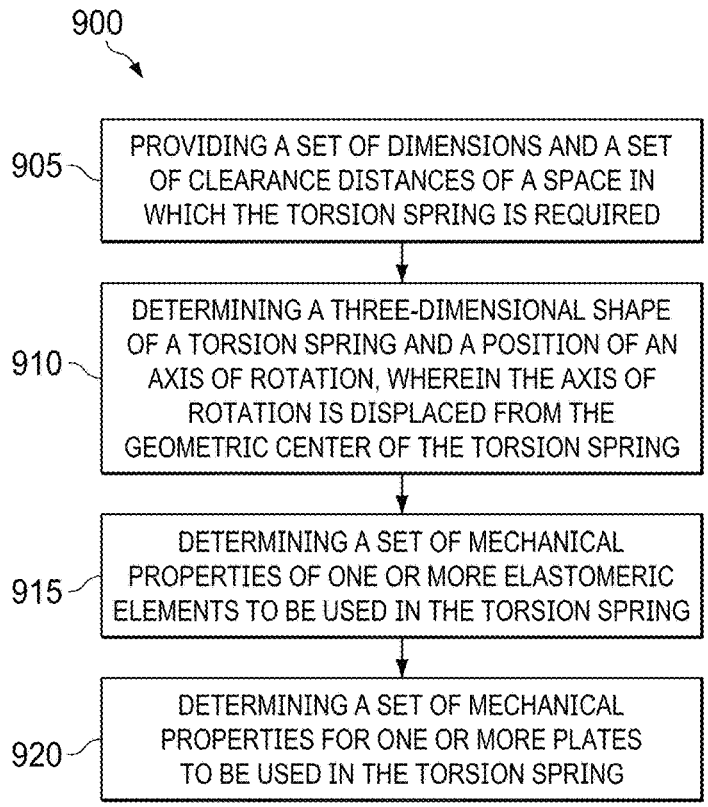
FIG. 9 illustrates a flowchart of a method embodiment of the present invention.

FIG. 9 illustrates a flowchart of a method embodiment of the present invention. Method 900 of designing a torsion spring includes block 905, providing a set of dimensions and a set of clearance distances of a space in which the torsion spring is required. Block 910 includes determining a three-dimensional shape of a torsion spring and a position of an axis of rotation, wherein the axis of rotation is displaced from the geometric center of the torsion spring. Determining a set of mechanical properties of one of more elastomeric elements to be used in the torsion spring is included in Block 915. In Block 920, a set of mechanical properties for one or more plates to be used in the torsion spring is determined. Method 900 may further include determining a three-dimensional shape of a torsion spring and a position of an axis of rotation, wherein the axis of rotation is displaced from the geometric center of the torsion spring; determining a set of mechanical properties of one of more elastomeric elements to be used in the torsion spring; or determining a set of mechanical properties for one or more plates to be used in the torsion spring. Method 900 may be implemented by a computer program encoded on a non-transitory computer-readable medium for execution by a processor operable to design a torsion spring.

The skilled artisan will recognize that torsion springs 500 and 600 provide reduced-weight, stiff springs that may be used in constricted spaces and that provide shear and torque.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of." As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step, or a limitation) or group of integers (e.g., feature(s), element(s), characteristic(s), property(ies), method/process(s) steps, or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about," "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the devices and/or methods disclosed and claimed herein can be made and executed without undue experimentation in light of the present disclosure. While the devices and/or methods of this invention have been described in terms of particular embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope, and concept of the invention as defined by the appended claims.

Furthermore, no limitations are intended to the details of construction or design herein shown, other than as described in the claims below. It is therefore evident that the particular embodiments disclosed above may be altered or modified and all such variations are considered within the scope and spirit of the disclosure. Accordingly, the protection sought herein is as set forth in the claims below.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order.

To aid the Patent Office, and any readers of any patent issued on this application in interpreting the claims appended hereto, applicants wish to note that they do not intend any of the appended claims to invoke 35 U.S.C. § 112(f) as it exists on the date of filing hereof unless the words "means for" or "step for" are explicitly used in the particular claim.

What is claimed is:

1. An asymmetric torsion spring comprising:
   an asymmetric middle plate having a first attachment point displaced from a geometric center of the middle plate;
   one or more first asymmetric elastomeric elements, wherein one of the first asymmetric elastomeric elements proximate to a first side of the asymmetric middle plate is secured to the first side of the asymmetric middle plate and, wherein the one or more first asymmetric elastomeric elements has an opening coincident with the first attachment point of the asymmetric middle plate;
   one or more second asymmetric elastomeric elements, wherein one of the second asymmetric elastomeric elements proximate to a second side of the asymmetric middle plate is secured to the second side of the middle plate, and wherein the one or more second elastomeric elements has an opening coincident with the first attachment point of the middle plate;
   a first outer plate secured to one of the first asymmetric elastomeric elements proximate to the first outer plate and having an opening coincident with the first attachment point of the asymmetric middle plate; and
   a second outer plate secured to one of the second asymmetric elastomeric elements proximate to the second outer plate and having an opening coincident with the attachment point of the asymmetric middle plate;
   wherein rotation of an item attached to the torsion spring at the first attachment point rotationally displaces the asymmetric middle plate relative to the first outer plate and the second outer plate and stores energy in the one or more first asymmetric elastomeric elements and the one or more second asymmetric elastomeric elements, and wherein the asymmetric torsion spring provides shear stress to the item when energy is stored in the one or more first asymmetric elastomeric elements and the one or more second asymmetric elastomeric elements and provides torque to the item as the one or more first asymmetric elastomeric elements and the one or more second asymmetric elastomeric elements return to respective neutral positions.

2. The torsion spring of claim 1, wherein the one or more first asymmetric elastomeric elements or the one or more second asymmetric elastomeric elements comprise one or more polymers or one or more rubbers.

3. The torsion spring of claim 1, wherein the first outer plate or the second outer plate comprises one or more spacers.

4. The torsion spring of claim 1, wherein the second outer plate comprises a second attachment point.

5. The torsion spring of claim 1, further comprising one or more shims, each shim having an elastic modulus value less than one or more elastic modulus values of the one or more first elastomeric elements or the one or more second elastomeric elements, each of the one or more shims disposed between two of the one or more first elastomeric elements or two of the one or more second elastomeric elements.

6. The torsion spring of claim 5, wherein the one or more shims are metallic.

7. A torsion spring comprising:
   a middle plate having an opening displaced from a geometric center of the middle plate;
   an elastomeric element having a first portion and a second portion, the first portion secured to a first side of the middle plate and the second portion secured to a second side of the middle plate, and the elastomeric element having an opening coincident with the opening of the middle plate;
   a first outer plate secured to the first portion of the elastomeric element, having an indentation coincident with the opening of the middle plate, and having a first attachment point in the indentation; and
   a second outer plate secured to the second portion of the elastomeric element and secured to the first outer plate at the indentation;
   wherein rotation of an item attached to the torsion spring at the first attachment point rotationally displaces the first outer plate and the second outer plate relative to the middle plate and stores energy in the elastomeric element; and
   wherein the torsion spring provides shear stress to the item when energy is stored in the elastomeric element and provides torque to the item as the elastomeric element returns to a neutral position.

8. The torsion spring of claim 7, wherein the elastomeric element comprises one or more polymers, or one or more rubbers.

9. The torsion spring of claim 7, wherein the middle plate comprises one or more spacers.

10. The torsion spring of claim 7, wherein the second outer plate comprises a second attachment point.

11. An asymmetric torsion spring kit comprising:
an asymmetric torsion spring comprising:
an asymmetric middle plate having a first attachment point displaced from a geometric center of the middle plate;
one or more first asymmetric elastomeric elements, wherein one of the first asymmetric elastomeric elements proximate to a first side of the middle plate is secured to the first side of the asymmetric middle plate and, and wherein the one or more first asymmetric elastomeric elements has an opening coincident with the first attachment point of the asymmetric middle plate;
one or more second asymmetric elastomeric elements, wherein one of the second asymmetric elastomeric elements proximate to a second side of the asymmetric middle plate is secured to the second side of the asymmetric middle plate, and wherein the one or more second asymmetric elastomeric elements has an opening coincident with the first attachment point of the asymmetric middle plate;
a first outer plate secured to one of the first asymmetric elastomeric elements proximate to the first outer plate and having an opening coincident with the first attachment point of the asymmetric middle plate; and
a second outer plate secured to one of the second asymmetric elastomeric elements proximate to the second outer plate and having an opening coincident with the attachment point of the asymmetric middle plate;
wherein rotation of an item attached to the torsion spring at the first attachment point rotationally displaces the asymmetric middle plate relative to the first outer plate and the second outer plate and stores energy in the one or more first asymmetric elastomeric elements and the one or more asymmetric second elastomeric elements, and wherein the asymmetric torsion spring provides shear stress to the item when energy is stored in the one or more first asymmetric elastomeric elements and the one or more second asymmetric elastomeric elements and provides torque to the item as the one or more first asymmetric elastomeric elements and the one or more second asymmetric elastomeric elements return to respective neutral positions.

12. The kit of claim 11, wherein the one or more first asymmetric elastomeric elements or the one or more asymmetric second elastomeric elements comprise one or more polymers or one or more rubbers.

13. The kit of claim 11, wherein the first outer plate or the second outer plate comprises one or more spacers.

14. The kit of claim 11, wherein the second outer plate comprises a second attachment point.

15. The kit of claim 11, further comprising one or more shims, each shim having an elastic modulus value less than one or more elastic modulus values of the one or more first elastomeric elements or the one or more second elastomeric elements, each of the one or more shims disposed between two of the one or more first elastomeric elements or two of the one or more second elastomeric elements.

16. The kit of claim 15, wherein the one or more shims are metallic.

17. An asymmetric torsion spring kit comprising:
an asymmetric torsion spring comprising:
an asymmetric middle plate having an opening displaced from a geometric center of the asymmetric middle plate;
an asymmetric elastomeric element having a first portion and a second portion, the first portion secured to a first side of the asymmetric middle plate and the second portion secured to a second side of the asymmetric middle plate, and the asymmetric elastomeric element having an opening coincident with the opening of the asymmetric middle plate;
a first outer plate secured to the first portion of the asymmetric elastomeric element, having an indentation coincident with the opening of the middle plate, and having a first attachment point in the indentation;
a second outer plate secured to the second portion of the asymmetric elastomeric element and secured to the first outer plate at the indentation;
wherein rotation of an item attached to the asymmetric torsion spring at the first attachment point rotationally displaces the first outer plate and the second outer plate relative to the asymmetric middle plate and stores energy in the asymmetric elastomeric element; and
wherein the torsion spring provides shear stress to the item when energy is stored in the asymmetric elastomeric element and provides torque to the item as the asymmetric elastomeric element returns to a neutral position.

18. The kit of claim 17, wherein the asymmetric elastomeric element comprises one or more polymers, or one or more rubbers.

19. The kit of claim 17, wherein the middle plate comprises one or more spacers.

20. The kit of claim 17, wherein the second outer plate comprises a second attachment point.

21. A method of designing an asymmetric torsion spring comprising:
providing a set of dimensions and a set of clearance distances of a space in which the asymmetric torsion spring is required;
providing one or more mechanical properties required of the asymmetric torsion spring;
determining a three-dimensional shape of the asymmetric torsion spring and a position of an axis of rotation, wherein the axis of rotation is displaced from a geometric center of the asymmetric torsion spring;
determining a set of mechanical properties of one of more asymmetric elastomeric elements to be used in the asymmetric torsion spring;
determining a set of mechanical properties for one or more plates to be used in the asymmetric torsion spring;
wherein the asymmetric torsion spring is to provide shear stress to an item attached to the asymmetric torsion spring as the item is rotated and energy is stored in the one or more asymmetric elastomeric elements and to provide torque to the item as the one or more asymmetric elastomeric elements return to respective neutral positions.

22. The method of claim 21, wherein the mechanical properties of the one or more asymmetric elastomeric elements include at least one of the following: thickness, strength, density, stiffness, torsion, stress, and strain.

23. The method of claim 21, wherein the mechanical properties of the one or more plates include at least one of the following: thickness, strength, density, stiffness, torsion, stress, and strain.

24. The method of claim 21, further comprising determining a set of mechanical properties for one or more metallic shims to be used in the asymmetric torsion spring.

25. A non-transitory computer-readable medium encoded with a computer program for execution by a processor operable to design an asymmetric torsion spring, the computer program comprising:
providing a set of dimensions and a set of clearance distances of a space in which the asymmetric torsion spring is required;
providing one or more mechanical properties required of the asymmetric torsion spring;
determining a three-dimensional shape of the asymmetric torsion spring and a position of an axis of rotation, wherein the axis of rotation is displaced from a geometric center of the asymmetric torsion spring;
determining a set of mechanical properties of one of more asymmetric elastomeric elements to be used in the asymmetric torsion spring; and
determining a set of mechanical properties for one or more plates to be used in the asymmetric torsion spring;
wherein the asymmetric torsion spring is to provide shear stress to an item attached to the asymmetric torsion spring as the item is rotated and energy is stored in the one or more asymmetric elastomeric elements and to provide torque to the item as the one or more asymmetric elastomeric elements return to respective neutral positions.

* * * * *